(12) United States Patent
Uehara et al.

(10) Patent No.: US 7,678,454 B2
(45) Date of Patent: Mar. 16, 2010

(54) METHOD FOR FORMING FINELY-STRUCTURED PARTS, FINELY-STRUCTURED PARTS FORMED THEREBY, AND PRODUCT USING SUCH FINELY-STRUCTURED PART

(75) Inventors: Shin-Ichi Uehara, Tokyo (JP); Yuko Sato, Tokyo (JP); Ken Sumiyoshi, Tokyo (JP); Setsuo Kaneko, Tokyo (JP); Jin Matsushima, Tokyo (JP)

(73) Assignee: NEC Corporation, Tokyo (JP)

( * ) Notice: Subject to any disclaimer, the term of this patent is extended or adjusted under 35 U.S.C. 154(b) by 139 days.

(21) Appl. No.: 11/927,730

(22) Filed: Oct. 30, 2007

(65) Prior Publication Data

US 2008/0057731 A1   Mar. 6, 2008

Related U.S. Application Data

(63) Continuation of application No. 10/410,254, filed on Apr. 10, 2003, now Pat. No. 7,329,611.

(30) Foreign Application Priority Data

Apr. 11, 2002   (JP) .............................. 2002-109447

(51) Int. Cl.
*B32B 17/00* (2006.01)
(52) U.S. Cl. ..................... 428/410; 428/34.4; 428/312.6
(58) Field of Classification Search ................. 428/426, 428/441, 410, 307.3; 359/620, 642, 796
See application file for complete search history.

(56) References Cited

U.S. PATENT DOCUMENTS 5,871,653 A   2/1999   Ling

| 6,108,063 A | 8/2000 | Yuuki et al. |
| 6,343,862 B1 | 2/2002 | Sawai et al. |
| 6,437,918 B1 * | 8/2002 | Hamanaka et al. .......... 359/620 |

FOREIGN PATENT DOCUMENTS

| JP | H06-082832 | 3/1994 |
| JP | 9-43587 | 2/1997 |
| JP | 9-227151 | 9/1997 |

(Continued)

OTHER PUBLICATIONS

The Society of Polymer Science, Japan, "Nano-Technology and Macromolecule," pp. 117-118 (Jan. 8, 2002).

(Continued)

*Primary Examiner*—Timothy M Speer
*Assistant Examiner*—Lauren Robinson
(74) *Attorney, Agent, or Firm*—Young & Thompson

(57) ABSTRACT

In a formation method for forming a fine structure in a workpiece (30) containing an etching control component, using an isotropic etching process, a mask (32, 34) having an opening (36) is applied to the workpiece, and the workpiece is etched with an etching solution (38) to thereby form a recess (40), corresponding to a shape of the opening, in a surface of the workpiece. The etching of the workpiece is stopped due to the etching control component eluted out of the workpiece in the etching solution within the recess during the isotropic etching process.

3 Claims, 18 Drawing Sheets

FOREIGN PATENT DOCUMENTS

| | | |
|---|---|---|
| JP | 10-39110 | 2/1998 |
| JP | 10-223367 A | 8/1998 |
| JP | H11-283751 | 10/1999 |
| JP | 2000-081625 | 3/2000 |
| JP | 2000-298267 | 10/2000 |
| JP | 2000-319693 | 11/2000 |
| JP | 2001-074913 | 3/2001 |
| JP | 2001-074935 | 3/2001 |
| JP | 2001-147305 | 5/2001 |
| JP | 2001-201609 | 7/2001 |
| JP | 2001-246599 | 9/2001 |
| JP | 2002-031793 | 1/2002 |

OTHER PUBLICATIONS

Kouritsu Publishing Company, "Optical Switching and Optical Interconnection," p. 137 (Apr. 24, 1998).

Applied Optics, "Fabrication of Multilevel Phase Computer-Generated Hologram Elements Based on Effective Medium Theory," vol. 39, No. 20, pp. 3531-3536 (Jul. 10, 2000).

Karasawa et al., "Organic Electric Field Luminescence Element," Eng. Abst. Of JP 10-223367 A (Aug. 21, 1998).

* cited by examiner

METHOD FOR FORMING FINELY-STRUCTURED PARTS, FINELY-STRUCTURED PARTS FORMED THEREBY, AND PRODUCT USING SUCH FINELY-STRUCTURED PART

This application is a Continuation of U.S. Ser. No. 10/410,254 filed on Apr. 10, 2003, issued as U.S. Pat. No. 7,329,611 on Feb. 12, 2008. This application claims priority to Japanese Application No. JP 2002-109447 filed on Apr. 11, 2002.

BACKGROUND OF THE INVENTION

1. Field of the Invention

The present invention relates to a formation method for forming finely-structured parts, using an isotropic etching process. Also, the present invention relates to a finely-structured part formed by the formation method, and a product using such a finely-structured part.

2. Description of the Related Art

With the recent advance of fine-structure-formation technology, it has attempted to provide higher function, higher performance, and additional value for various existing products, using the fine-structure-formation technology. Especially, at present, since it is possible to perform processing of finely-structured parts on a fine scale corresponding to the order of light wavelength, the trials are promising in various fields in which the finely-structured parts are necessitated.

For example, in the field of liquid crystal displays equipped with a back light unit, in order to increase brightness of the liquid crystal display, and in order to decrease electric power consumption of the back light unit, it is proposed that an array of micro-lenses be associated with a glass substrate of the liquid crystal display, with a size of each micro-lens being on the order of a pixel size of the liquid crystal display.

In particular, in the liquid crystal display, an aperture is formed in each pixel area to thereby introduce the light therethrough, but an area of the aperture is inevitably restricted due to an arrangement of wiring patterns and electrode patterns. Especially, in a TFT (thin film transistor) liquid crystal display of active matrix type, an aperture rate of the aperture area to each pixel area is less than 60%. Of course, the smaller the aperture rate, the darker the brightness of the liquid crystal display. Thus, before the brightness of the liquid crystal display can be made higher, it is necessary to increase the amount of light to be introduced into each pixel area, and thus the electric power consumption of the back light unit becomes larger.

However, if the micro-lens array is associated with the liquid crystal display so that the aperture rate is virtually increased at each pixel area, i.e. if the amount of light to be introduced into each pixel area is increased by the micro-lens array, it is possible to make the brightness of the liquid crystal display higher without the increase of the power consumption of the back light unit.

Also, it is proposed that an array of micro-lenses be assembled in a liquid crystal projector which may be used in a relatively light environment. In particular, in the liquid crystal projector, a liquid crystal display is used as a light-valve device having an array of light valves, and it is necessary to increase an amount of light passing through each light valve of the light-valve device before a projected image can be distinctly observed in the relatively light environment.

Japanese Laid-Open Patent Publication (KOKAI) No. 2001-201609 discloses a two-piece formation method as a process for forming an array of micro-lenses used in the liquid crystal projector. In particular, the micro-lens array is press-molded from a suitable uncured photo-curable resin on a suitable glass substrate, using a glass mold or matrix having an array of hemisphere-like micro-recesses formed in a molding face thereof. Then, the glass substrate carrying the molded micro-lenses is exposed to radiation of ultraviolet rays, thereby setting of the molded micro-lenses on the glass substrate. Thereafter, the glass matrix is removed, and the molded micro-lenses are left on the glass substrate, resulting in production of the micro-lenses arrayed on and adhered to the glass substrate.

Japanese Laid-Open Patent Publication (KOKAI) No. 2001-246599 also discloses another type two-piece formation method for forming an array of hemisphere-like micro-lenses. In this two-piece type formation method, a matrix for molding the hemisphere-like micro-lens array is made from a silicon substrate exhibiting a superior flatness and an excellent processability.

Further, Japanese Laid-Open Patent Publication (KOKAI) No. 2001-074913 discloses a transferring formation method including a heating process and a dry etching process to form an array of hemisphere-like micro-lenses used in the liquid crystal projector. In particular, an array of circular masks, composed of a suitable thermal deformable material, is formed on a suitable glass substrate, and is subjected to the heating process such that each circular mask is thermally deformed into a hemisphere-like shape. Then, the glass substrate carrying the hemisphere-like masks is subjected to the dry etching process, so that an array of hemisphere-like micro-lenses is formed in the glass substrate as if the array of hemisphere-like masks are transferred to the glass substrate.

Furthermore, Japanese Laid-Open Patent Publication (KOKAI) No. 2001-147305 discloses an isotropic-etching formation method including a wet etching process to form an array of hemisphere-like micro-lenses used in a liquid crystal projector. In particular, a silicon mask layer is formed on a quartz glass substrate, and an array of circular openings is formed in the silicon mask layer. Then, the quartz glass substrate having the mask layer is subjected to the wet etching process, whereby a hemisphere-like recess is formed in the quartz glass substrate at each circular opening of the silicon mask layer. Thereafter, the silicon mask layer is removed, thereby obtaining a hemisphere-like micro-lens array.

Although the micro-lens array is used in the liquid crystal display of the liquid crystal projector whereby the projected image can be distinctly observed in a relatively light environment, it is proposed that the array of micro-lenses is assembled in a semi-permeation type liquid crystal display which is operated in either a permeation-display mode or a reflection-display mode, as disclosed in Japanese Laid-Open Patent Publication (KOKAI) No. 2000-298267.

The semi-permeation type liquid crystal display includes a reflection plate associated with a back light unit, and an array of apertures is formed so as to be registered with an array of pixels of the liquid crystal display, an area of each aperture being smaller than a size of each pixel. In the permeation-display mode, a displayed image is based on the light emitting from the back light unit and passing through the apertures of the reflector plate. In the reflection-display mode, a displayed image is based on the light reflected from the reflection plate. Accordingly, in the semi-permeation type liquid crystal display, since an aperture rate of the aperture area to the pixel area is considerably restricted, it is advantageous to intervene the micro-lens array between the reflector plate and the back light unit to make the brightness higher in the permeation-display mode.

As another example of the finely-structured parts, there is a planar light wave circuit device as disclosed in "Optical Switching And Optical Interconnection", written by Kenichi YUKIMATSU and published by KYORITSU PUBLISHING COMPANY. The planar light wave circuit device includes a quartz glass substrate having optical light guide paths, optical switches, optical couplers, optical splitters and so on formed therein. When the planar light wave circuit device is too miniaturized, light-transmission losses becomes larger, and wavelength-separation characteristics are deteriorated. Namely, the planar light wave circuit device has a limitation of miniaturization. Thus, the formation of the various optical elements must be performed by processing the quartz glass substrate having a relatively large area size.

Japanese Laid-Open Patent Publication (KOKAI) No. EHI-06-082832 discloses an active-matrix type liquid crystal display which includes a TFT (thin film transistor) substrate as a finely-structured part. In this TFT substrate, a wiring pattern is buried in the TFT substrate to smooth the surface of the TFT substrate, whereby liquid crystal molecules are more uniformly oriented, resulting in an improvement of display performance in the liquid crystal display.

Japanese Laid-Open Patent Publication (KOKAI) No. EHI-11-283751 discloses an organic electroluminescence device which includes a diffraction grating as a finely-structured part. The diffraction grating is assembled in the electroluminescence device to efficiently take out light from a luminescence layer of the electroluminescence device. The diffraction grating comprises a suitable substrate in which a plurality of fine grooves is regularly formed at a pitch corresponding to the order of a light wavelength. Namely, before the diffraction grating can be produced, it is necessary to process the substrate such that a sub-wavelength periodic structure is formed in the substrate.

Japanese Laid-Open Patent Publication (KOKAI) No. 2000-081625 discloses a liquid crystal display which includes a pair of alignment layers as a finely-structured part. In the liquid crystal display, a liquid crystal is confined in a space defined between the alignment layers such that the molecules of the liquid crystal are regularly oriented. Usually, the alignment layer is made of a suitable organic film, such as a polyimide film, and is produced by a rubbing method. In this method, the polyimide film is rubbed with, for example, a cotton cloth in a given direction, such that a plurality of fine grooves are regularly formed in a surface of the polyimide film. The rubbing method has drawbacks in that the polyimide film is susceptible to scratches and dust particles while being rubbed with the cotton cloth. Therefore, it is proposed that the alignment layer be made of an inorganic material. Namely, before the inorganic alignment layer can be produced, it is necessary to process an inorganic layer such that a submicron periodic structure is formed in the inorganic layer.

Japanese Laid-Open Patent Publication (KOKAI) No. 2001-074935 discloses an optical polarization element as a finely-structured part. Although the optical polarization element is usually made of an optical material exhibiting a polarization-anisotropy, it is possible to make the optical polarization element of an optical isotropic material. In particular, the latter optical polarization element includes a substrate made of the optical isotropic material, and an ultra-fine birefringence structure formed in the optical isotropic substrate. For the formation of the ultra-fine birefringence structure, it is possible to utilize a fine-structure-formation technology as disclosed in, for example, Applied Optics Vol. 39, No 20, 2000).

As still yet another example of the finely structured parts, there is a chemical microchip used in a chemical analysis system, such as µTAS (Micro Total Analysis Systems) LOC (Laboratory On Chip) or the like, as disclosed in "Nano-Technology And Macromolecule" published by THE SOCIETY OF POLYMER SCIENCE, JAPAN. The chemical microchip includes a suitable substrate in which grooves and recesses are formed in the order of microns or tens of microns.

As discussed above, the fine-structure-formation technology can be applied to the various technical fields. In all cases, a substrate is processed to form a fine structure therein, thereby producing a finely-structured part. The processing of the substrate should be uniformly and equally performed before the fine structure can be formed in the substrate at high precision to thereby obtain the finely-structured part having a high-quality. Also, in order to inexpensively supply the finely-structured parts to a market, it is necessary to efficiently perform the production of the finely-structured parts at low cost.

The efficient production of the finely-structured parts is possible by using a large-sized substrate in which a plurality of fine structures are simultaneously formed. Namely, after the plurality of fine structures are formed in the large-sized substrate, it is divided into respective substrate sections having the fine structures, and thus it is possible to lower production cost of the individual finely-structured parts. However, conventionally, the large-sized substrate is not utilized for the reasons stated below.

For example, in the aforesaid two-piece formation method for forming the micro-lens array, it is difficult to produce a large-sized glass mold or matrix having a plurality of micro-recess arrays formed in a molding face thereof. Although the large-sized matrix is produced, when there is a thermal expansion difference between the large-sized matrix and the large-sized substrate, it is necessary to strictly control a processing-temperature during the production of the plurality of micro-lens arrays, such that thermal strains, based on the thermal expansion difference, can be eliminated from the plurality of micro-lens arrays as much as possible. Of course, it is very troublesome to strictly control the processing-temperature. Also, in the two-piece formation method, the plurality of micro-lens arrays is press-molded from a suitable uncured photo-setting resin on the large-sized substrate, using the large-sized matrix, and it is difficult to uniformly exert a pressure to the large-sized matrix.

In the aforesaid transferring formation method including the heating process and the dry etching process to form the micro-lens array, although it is possible to uniformly and equally process the large-sized substrate so as to form a plurality of micro-lens arrays in the large-sized substrate, facilities for performing the transferring formation method must have a large-scale for processing the large-sized substrate. Of course, large-scale facilities are very expensive, resulting in an increase of a production cost of the micro-lens arrays. Also, the facilities include a vacuum chamber for performing the dry etching process, and it takes too much time for evacuating the vacuum chamber, resulting in a lowering of production efficiency of the micro-lens arrays. Furthermore, it is practically impossible to process more than one large-sized substrate in the vacuum chamber.

In the aforesaid isotropic-etching formation method including the wet etching process to form the micro-lens array, it is possible to process the large-sized substrate to form a plurality of micro-lens arrays in the large-sized substrate at a relatively low cost, because an etching cell for the wet etching process is merely made larger such that the large-sized substrate is sufficiently received in an etching solution held therein. However, it is very difficult to properly control the wet etching process such that a whole of the large-sized substrate is uniformly subjected to the etching process.

Namely, for example, it is difficult to maintain the entire etching solution at a given constant etching temperature when the large etching cell is used. Also, it is necessary to make the large-sized substrate of an expensive material containing substantially no impurities, such as quartz glass, silicon or the like, before the wet etching process can be properly controlled.

Similar matters are substantially true for the other finely-structured parts, i.e. the planar light wave circuit device, the active-matrix type liquid crystal display, the organic electroluminescence device, the orientation film, the optical polarization element as a finely-structured part, and the chemical microchip.

SUMMARY OF THE INVENTION

Therefore, a main object of the present invention is to provide a formation method for forming finely-structured parts, using an isotropic etching process, in which a large-sized substrate can be uniformly and equally processed at a low cost to thereby form the finely-structured parts in the large-sized substrate.

Another object of the present invention is to provide such a finely-structured part having a high quality, formed by the aforesaid formation method.

Yet another object of the present invention is to provide a product using such a finely-structured part.

In accordance with an aspect of the present invention, there is provided a formation method for forming a finely-structure in a workpiece containing an etching control component, using an isotropic etching process. The formation method comprises applying a mask, having at least one opening, to the workpiece, and etching the workpiece with an etching solution to thereby form a recess, corresponding to a shape of the opening, in a surface of the workpiece. The etching of the workpiece is stopped due to the etching control component eluted out of the workpiece in the etching solution within the recess during the isotropic etching process.

The eluted etching-control component may react with an etchant component of the etching solution to produce insoluble matter in the etching solution. The stoppage of the etching of the workpiece results from accumulation of the insoluble matter on an inner surface of the recess.

The etching-control component may be composed of at least one selected from the group consisting of aluminum oxide, magnesium oxide, calcium oxide, potassium oxide, strontium oxide, barium oxide, lithium oxide, sodium oxide, cesium oxide, zinc oxide, and lead oxide. The etchant component may be fluoric acid.

The eluted etching-control component may be insoluble matter in the etching solution. The stoppage of the etching of the workpiece results from accumulation of the insoluble matter on an inner surface of the recess. In this case, the etching-control component is composed of at least one selected from the group consisting of calcium fluoride, potassium fluoride, barium fluoride, aluminum fluoride, strontium fluoride, and magnesium fluoride. The etchant component may be fluoric acid.

BRIEF DESCRIPTION OF THE DRAWINGS

The above objects and other objects will be more clearly understood from the description set forth below, with reference to the accompanying drawings, wherein.

DESCRIPTION OF THE PREFERRED EMBODIMENTS

Before descriptions of embodiments of the present invention, for better understanding of the present invention, conventional formation methods of forming a finely-structured part will be explained with reference to FIGS. 1A to 1C, FIGS. 2A to 2C, and FIGS. 3A to 3C.

Figure 1A:
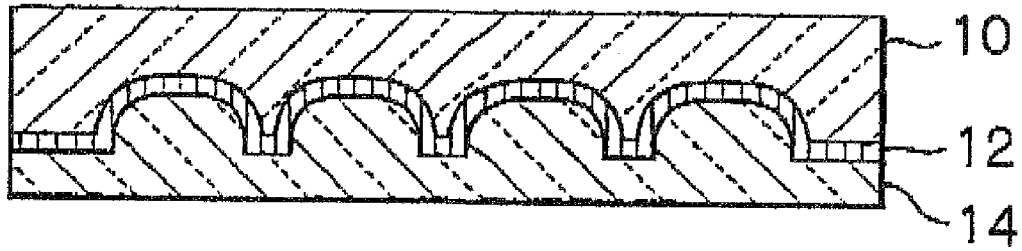
FIG. 1A is a conceptual explanatory view showing a representative step of a conventional two-piece formation method for forming a micro-lens array.
Figure 1B:
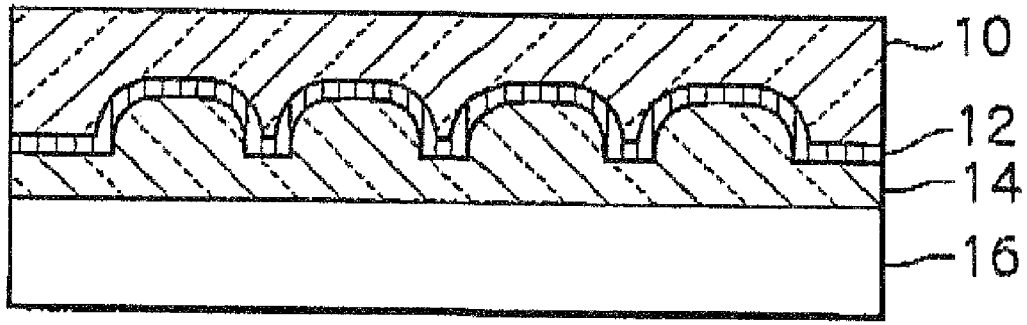
FIG. 1B is a conceptual explanatory view showing another representative step of the conventional two-piece formation method.
Figure 1C:
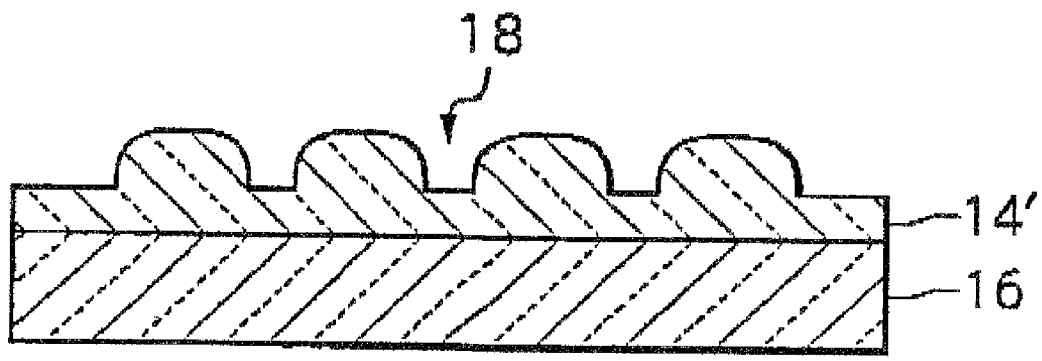
FIG. 1C is a conceptual explanatory view showing yet another representative step of the conventional two-piece formation method.

FIGS. 1A to 1C conceptually show representative steps of a two-piece formation method for forming a micro-lens array, as disclosed in the aforesaid JPP (KOKAI) No. 2001-201609.

In the two-piece formation method, a glass mold or matrix 10 having an array of hemisphere-like micro-recesses formed in a molding face thereof is prepared, as shown in FIG. 1A.

The molding face of the matrix 10 is coated with mold release agent to form a mold release agent layer 12, and then a suitable uncured transparent photo-curable resin is applied to the molding face of the matrix 10 to form a resin layer 14.

The matrix 10 carrying both the mold release agent 12 and the uncured resin layer 14 is placed on and pressed against a suitable glass substrate 16, thereby press-molding the uncured resin layer 14, as shown in FIG. 1B. Then, the matrix 10 carrying the mold release agent layer 12 is removed such that the press-molded resin layer 14 is left as a micro-lens layer 14' on the glass substrate 16, shown in FIG. 1C.

Thereafter, in order to cure the micro-lens layer 14', it is irradiated with ultraviolet rays. Thus, the micro-lens layer 14' is securely adhered to the glass substrate 16, resulting in production of a micro-lens array 18 including the micro-lens layer 14' and the glass substrate 16 (FIG. 1C).

The two-piece formation method is unsuitable for a case where a plurality of micro-lens array are formed on a large-sized substrate, for the reasons already state above.

Figure 2A:
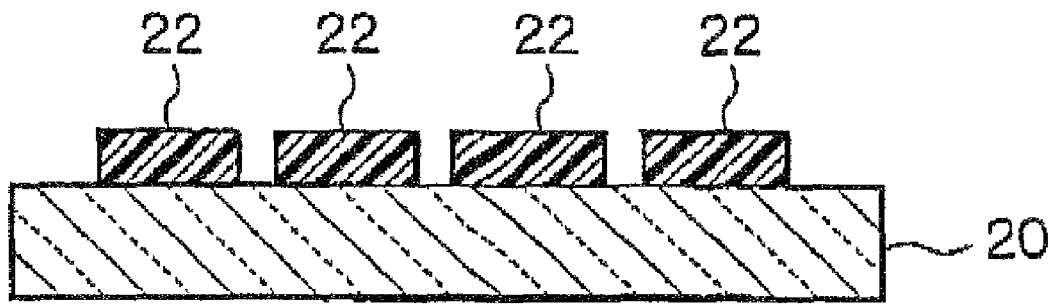
FIG. 2A is a conceptual explanatory view showing a representative step of a transferring formation method including a heating process and a dry etching process to form a hemisphere-like micro-lens array.
Figure 2B:
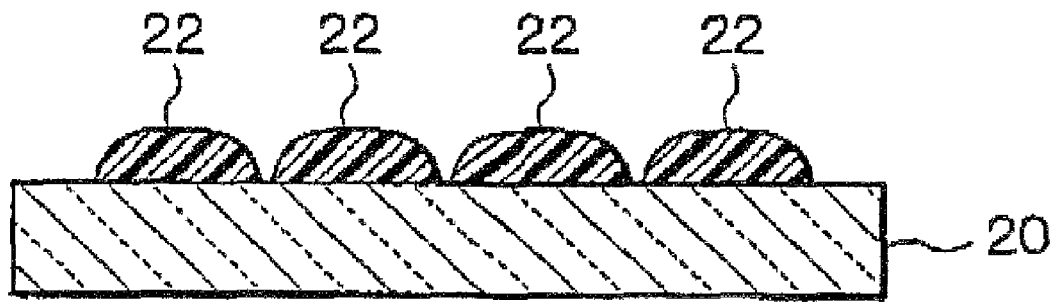
FIG. 2B is a conceptual explanatory view showing another representative step of the conventional transferring formation method.
Figure 2C:
FIG. 2C is a conceptual explanatory view showing yet another representative step of the conventional transferring formation method.

FIGS. 2A to 2C conceptually show representative steps of a transferring formation method including a heating process and a dry etching process to form a hemisphere-like micro-lens array, as disclosed in the aforesaid JPP (KOKAI) No. 2001-074913.

In the transferring formation method, a quartz glass substrate 20 is prepared, and an array of circular masks 22, composed of a suitable thermal deformable material, is formed on the glass substrate 20, as shown in FIG. 2A. Then, the glass substrate 20 carrying the array of circular masks 22 is subjected to the heating process such that each circular mask 22 is thermally fused and deformed into a hemisphere-like shape, as shown in FIG. 2B.

After the heating process, the glass substrate 20 carrying the hemisphere-like masks 22' is subjected to the dry etching process, so that the glass substrate 20 is formed as a hemisphere-like micro-lens array 20', as shown in FIG. 2C. In particular, during the dry etching process, each hemisphere-like mask 22 itself is etched so that the etching of the glass substrate 20 is controlled due to the existence of the hemisphere-like masks 22' as if the array of hemisphere-like masks 22' is transferred to the glass substrate 20.

The transferring formation method is also unsuitable for a case where a plurality of micro-lens arrays are formed on a large-sized substrate, for the reasons already stated above.

Figure 3A:
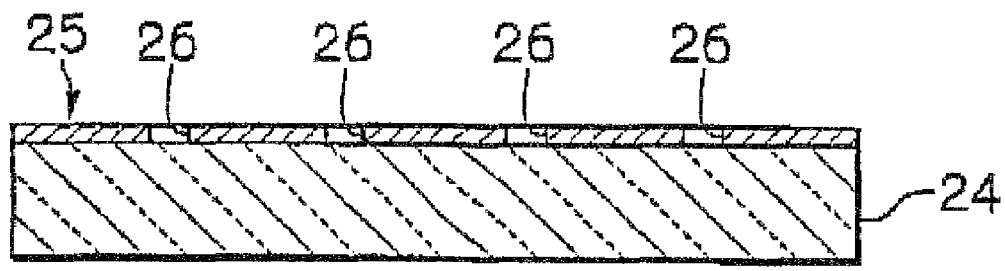
FIG. 3A is a conceptual explanatory view showing a representative step of an isotropic-etching formation method including a wet etching process to form a hemisphere-like micro-lens array.
Figure 3B:
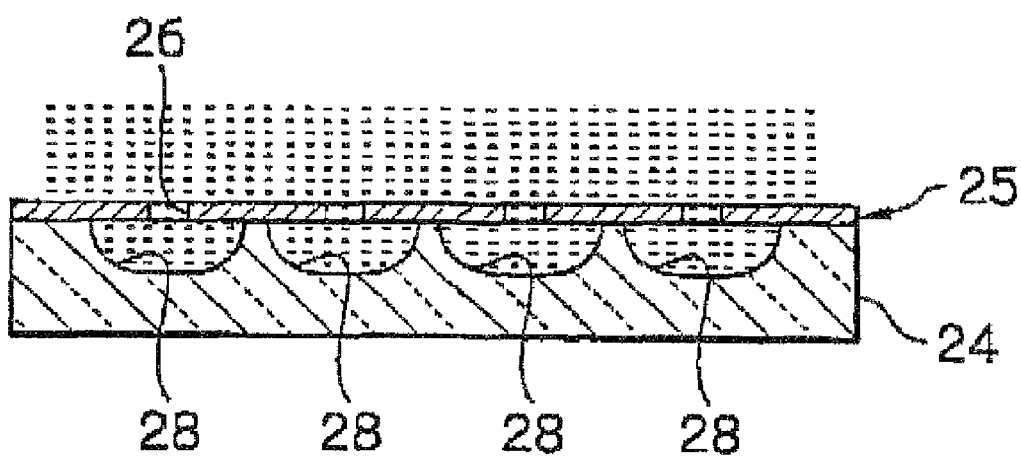
FIG. 3B is a conceptual explanatory view showing another representative step of the conventional isotropic-etching formation method.
Figure 3C:
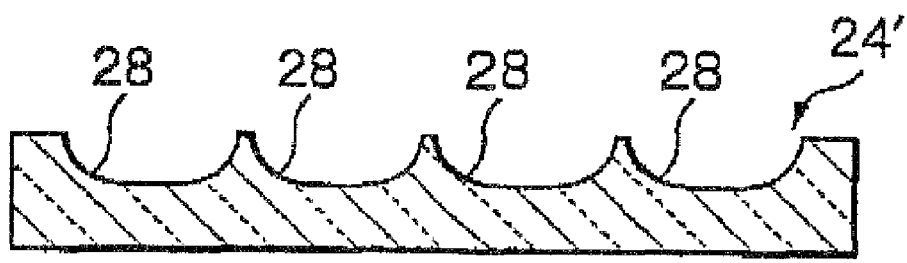
FIG. 3C is a conceptual explanatory view showing yet another representative step of the conventional isotropic-etching formation method.

FIGS. 3A to 3C conceptually show representative steps of an isotropic-etching formation method including a wet etching process to form a hemisphere-like micro-lens array, as disclosed in the aforesaid JPP (KOKAI) No. 2001-147305.

In the isotropic-etching formation method, a quartz glass substrate 24 is prepared, and a silicon mask layer 25 having an array of circular openings 26 is formed on the quartz glass substrate 24, as shown in FIG. 3A. Then, the quartz glass substrate 24 having the silicon mask layer 25 is immersed in an etching solution so as to be subjected to the wet etching process, as shown in FIG. 3B.

Thus, the quartz glass substrate 24 is etched such that a hemisphere-like recess 28 is formed in the quartz glass substrate 24 at each circular opening 26 of the silicon mask layer 25. Thereafter, the silicon mask layer 25 is removed, whereby the quartz glass substrate 24 is formed as a hemisphere-like micro-lens array 24' as shown in FIG. 3C.

The isotropic-etching formation method is also unsuitable for a case where a plurality of micro-lens arrays are formed on a large-sized substrate, for the reasons already stated above.

First Embodiment

FIGS. 4A to 4F conceptually show representative steps of a first embodiment of a formation method according to the present invention, to form a micro-lens array as a finely-structured part.

Figure 4A:
FIG. 4A is a conceptual explanatory view showing a representative step of a first embodiment of a formation method according to the present invention, to form a micro-lens array as a finely-structured part.

In FIG. 4A, reference 30 indicates a non-alkali glass (i.e. alkaline-earth boro-aluminosilicate glass) substrate having a thickness of 0.7 mm. The glass substrate 30 features a percentage composition of 49% silicon dioxide, 10% aluminum oxide, 15% boron oxide, 25% barium oxide, and 1% impurities, and these components are homogeneously distributed in the glass substrate 30. After the glass substrate 30 is rinsed, a mask layer 32 having a thickness of 100 nm is formed on the glass substrate 30 by a sputtering process, and then a positive type resist layer 34 of 1,000 nm is formed on the mask layer 32 by a spin-coat process, as shown in FIG. 4A. In this embodiment, the mask layer 32 is composed of chromium.

Figure 4B:
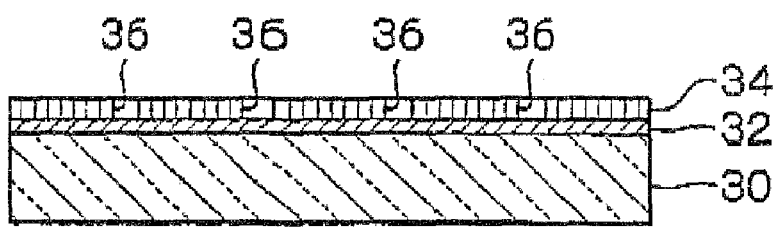
FIG. 4B is a conceptual explanatory view showing another representative step of the first embodiment of the formation method according to the present invention.
Figure 4C:
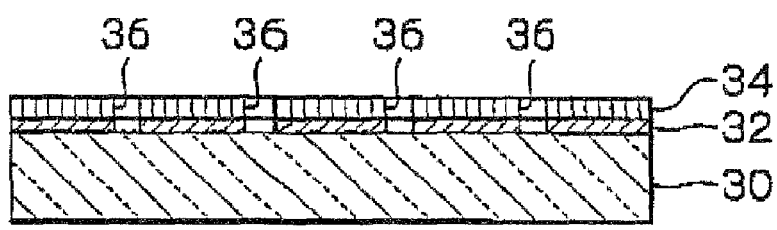
FIG. 4C is a conceptual explanatory view showing yet another representative step of the first embodiment of the formation method according to the present invention.

As shown in FIG. 4B, using a photolithography process, an array of circular openings 36 is formed in the resist layer 32. In this embodiment, each opening 36 has a diameter of 3 µm, and the openings 36 are arrayed at a pitch of 30 µm. Then, a chromium-etching solution composed of diammonium cerium nitrate as a main component is prepared, and the glass substrate 30 carrying both the layers 32 and 33 is immersed in the chromium-etching solution, whereby the mask layer (chromium) 32 is etched such that the openings 36 are extended into the mask layer 32, as shown in FIG. 4C.

After the etching process of the mask layer 32 (FIG. 4C) is completed, the resist layer 34 is preferably left on the mask layer 32 as it stands, because the resist layer 34 serves as a protective layer for the mask layer 32. Of course, the resist layer 4 may be removed from the mask layer 32 after the chromium-etching process, if necessary.

Figure 4D:
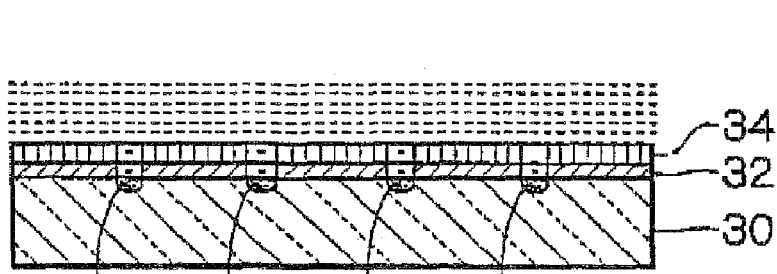
FIG. 4D is a conceptual explanatory view showing still yet another representative step of the first embodiment of the formation method according to the present invention.

Subsequently, as shown in FIG. 4D, the glass substrate 30 carrying both the layers 32 and 34 is immersed in an etching solution 38 over a time period of 20 min, whereby the glass substrate 30 is subjected to an isotropic etching process. The etching solution 38 is composed of an aqueous solution containing 10% fluoric acid as an etchant component, and is symbolically represented by a plurality of thick short bars in FIG. 4D. Note, during the isotropic etching process, the temperature of the etching solution 38 is maintained at 20° C.

Figure 4E:
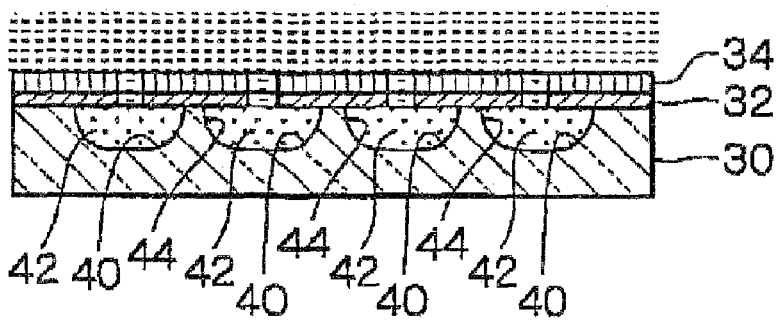
FIG. 4E is a conceptual explanatory view showing still yet another representative step of the first embodiment of the formation method according to the present invention.

At the beginning of the isotropic etching process, the glass substrate 30 is etched at an exposed circular area corresponding to each opening 36, and thus a minuscule hemisphere-like recess 40 is formed at each of the exposed circular areas of the glass substrate 30, as shown in FIG. 4D. As the etching of the glass substrate 30 progresses, each hemisphere-like recess 40 becomes larger, as shown in FIG. 4E. This is because a fresh part of the etching solution 38 is introduced into each hemisphere-like recess 40. Nevertheless, the etching of the glass substrate 30 is automatically stopped after the elapse of approximately 15 min from the immersion of the glass substrate 30 in the etching solution 38, due to production of insoluble matter 42, which is symbolically represented by a plurality of small solid circles in FIGS. 4D and 4E.

In particular, as the etching of the glass substrate 30 progresses, aluminum oxide and barium oxide are eluted out of the glass substrate 30 in each hemisphere-like recess 40, and react with fluoric acid to produce aluminum fluoride and barium fluoride. Namely, aluminum fluoride and barium fluoride are separated out as the insoluble matter 42. As the etching of the glass substrate 30 progresses, an amount of insoluble matter 42 is increased and accumulated on a inner surface of each hemisphere-like recess 40, so that the etching solution 38 cannot be gradually contacted with the inner surface of each hemisphere-like recess 40, and so that the introduction of the fresh part of the etching solution 38 into each hemisphere-like recess 40 is gradually prevented, resulting in the automatic stoppage of the etching of the glass substrate 30.

After the etching of the glass substrate 30 is stopped, the glass substrate 30 is taken out of the etching solution 38, and is processed with acetone to thereby remove the resist layer 34 therefrom. Subsequently, the glass substrate 30 is processed with the chromium-etching solution to thereby remove the mask layer 32 therefrom, and then the insoluble matter 42 is rinsed out of the hemisphere-like recesses 40.

Figure 4F:
FIG. 4F is a conceptual explanatory view showing still yet another representative step of the first embodiment of the formation method according to the present invention.

Thus, as shown in FIG. 4F, the glass substrate 30 is formed as a micro-lens array 30'. Strictly speaking, before the micro-lens array 30' can be used as a micro-lens array, it is necessary to fill the hemisphere-like recesses 40 with a suitable transparent material having a high refractive index.

In the first embodiment, when the etching of the glass substrate 30 is stopped, it was observed that the hemisphere-like recesses 40 are closely filled with the insoluble matter 42, and thus the accumulated insoluble matter 42 assist the support of the mask layer 34 such that the mask layer 32 cannot be easily peeled off from the glass substrate 30.

Although the remaining surfaces of the glass substrate 30 except for the surface thereof having the mask layer 32 are etched during the etching process (FIGS. 4D and 4E), the etching of the remaining surface may be disregarded because the quantity of etching is very small in comparison with the overall size of the glass substrate 30. However, the remaining surfaces of the glass substrate 30 may protected by an adhesive tape, and otherwise be coated with a suitable protective layer (not shown) composed of an epoxy-based resin material, a resist material used for the resist layer 32, a suitable metal material or the like. Note, in FIGS. 4A to 4E, the openings 36, the hemisphere-like recesses 40 and so on are exaggeratedly illustrated.

As is apparent from the foregoing, both the aluminum oxide component and the barium oxide component contained in the glass substrate 30 function as an etching-control component. Namely, as the amount of the etching-control component becomes larger, the etching of the glass substrate 30 is more prematurely stopped, and vice versa.

Under the above-mentioned conditions of the first embodiment, the etching of the glass substrate 30 is stopped when a diameter of each hemisphere-like recess 40 reaches a length of approximately 40 μm. Namely, the micro-lens array 30' includes the plurality of hemisphere-like recesses 40 arrayed at the pitch of 30 μm, with each hemisphere-like recess 40 having the diameter of approximately 40 μm. This means that the etching of the glass substrate 30 has been stopped such that two adjacent hemisphere-like recesses 40 are partially overlapped, with four column-like projections 44 being left in the glass substrate 30 at four locations circumferentially and uniformly spaced from each other at regular angular intervals of 90 degrees with respect to the center of each hemisphere-like recesses 40 (FIGS. 4E and 4F).

Both the diameter of the openings 36 and the array pitch of the openings 36 are significant factors to properly control the etching of the glass substrate. In particular, when the diameter of the openings 36 is too small, the etching of the glass substrate 30 may be prematurely stopped. Also, when the diameter of the openings 36 is too large, the insoluble matter 42 may flow out of the hemisphere-like recesses 40, whereby the etching of the glass substrate 30 becomes uncontrollable. Further, when the array pitch of the openings 36 is too small, the column-like projections 44 may be excessively thinned so that the mask layer 32 is liable to be peeled off from the glass substrate 30.

The inventors carried out experiments to investigate relationships between the diameter of the openings 36 and the array pitch of the openings 36 for properly controlling the etching of the glass substrate 30. The experimental results are shown in the following TABLE 1:

TABLE 1

|  | D = 1 μm | D = 3 μm | D = 5 μm | D = 10 μm | D = 30 μm |
|---|---|---|---|---|---|
| P = 10 μm | ○ | ○ | x | x | — |
| P = 20 μm | □ | ○ | ○ | x | — |
| P = 30 μm | □ | ○ | ○ | ○ | x |
| P = 50 μm | □ | □ | ○ | ○ | x |
| P = 100 μm | □ | □ | □ | ○ | ○ |

In TABLE 1, reference D indicates the diameter of the openings (36), and reference P indicates the array pitch of the openings (36). Also, reference ○ represents that the etching of the glass substrate (30) could be properly controlled; reference x represents that the etching of the glass substrate (30) was uncontrollable; and reference □ represents that the etching of the glass substrate (30) was prematurely stopped.

Note that the experiments were carried out under the same conditions as the first embodiment except that the diameter D of the openings (36) and the array pitch P of the openings (36) were varied as shown in TABLE 1.

As is apparent from TABLE 1, it was found that the diameter of the openings (36) should fall in a range between 1/10 of the array pitch P and 1/3 of the array pitch P before the etching of the glass substrate (30) can be properly controlled.

Also, when the etching of the glass substrate (30) could be properly controlled, it was found that a diameter of the formed hemisphere-like recesses (40) falls in a range from 1.0 P to 1.4 P (P=the array pitch). Accordingly, it is possible to utilize TABLE 1 in order to determine a diameter of hemisphere-like recesses (40) to be formed. For example, when the array pitch 30 μm is selected so that hemisphere-like recesses (40) having a diameter falling in a range from 30 μm to 40 μm are formed in a glass substrate (30), it can be known from TABLE 1 that a diameter of openings (36) to be formed in a mask (chromium) layer (32) should be selected from a range between 3 μm and 10 μm.

In the aforesaid first embodiment, although each of the openings 36 has the circular shape for the formation of the micro-lens array 30', each opening 36 may be formed as a square opening for the purpose of producing a finely-structured part except for the micro-lens array. Of course, in this case, an array of rectangular recesses is formed in a glass substrate due to the fact that the isotropic etching process is used in the formation method according to the present invention.

The inventors carried out experiments to investigate relationships between a side length of the square openings and an array pitch of the square openings for properly controlling an etching of the glass substrate. The experimental results are shown in the following TABLE 2:

TABLE 2

| | S = 1 μm | S = 3 μm | S = 5 μm | S = 10 μm | S = 30 μm |
|---|---|---|---|---|---|
| P = 10 μm | o | o | x | — | — |
| P = 20 μm | □ | o | o | x | — |
| P = 30 μm | □ | o | o | o | — |
| P = 50 μm | □ | □ | o | o | x |
| P = 100 μm | □ | □ | □ | o | o |

In TABLE 2, reference S indicates the side length of the square openings, and reference P indicates the array pitch of the square openings. Similar to TABLE 1, reference o represents that the etching of the glass substrate could be properly controlled; reference x represents that the etching of the glass substrate was uncontrollable; and reference □ represents that the etching of the glass substrate was prematurely stopped.

Note that the experiments were carried out under the same conditions as the first embodiment except that the side length S of the square openings and the array pitch P of the square openings were varied as shown in TABLE 2.

As is apparent from TABLE 2, it was found that the side length S of the square openings should fall in a range between 1/10 of the array pitch P and 1/3 of the array pitch P before the etching of the glass substrate can be properly controlled. Thus, it should be understood what shape an opening (36) to be formed in a mask (chromium) layer (32) can be given as long as the etching of the glass substrate is properly controlled. For example, the opening (36) may be shaped as a rectangle, an ellipse, an elongated slot or the like for the purpose of producing a finely-structured part except for the micro-lens array.

As stated above, in the first embodiment, the etching of the glass substrate 30 is automatically stopped after the elapse of approximately 15 min. from the immersion of the glass substrate 30 in the etching solution 38 composed of the 10% fluoric acid aqueous solution. When a time measured from the immersion of a glass substrate 30 to the automatic stoppage of the etching of the glass substrate 30 is defined as an etching time, there is of course a close relationship between the etching time and the fluoric acid density of the etching solution 38.

The inventors carried out experiments to investigate a relationship between the etching time and the fluoric acid density of the etching solution. The experimental results are shown in the following TABLE 3:

TABLE 3

| | DN | | | |
|---|---|---|---|---|
| | 5% | 10% | 20% | 30% |
| ET | 25 min. | 15 min. | 10 min. | 7 min. |

In TABLE 3, reference DN indicates the fluoric acid density of the etching solution, and reference ET indicates the etching time.

Note that the experiments were carried out under the same conditions as the first embodiment except that the fluoric acid density of the etching solution were varied as shown in TABLE 3.

As is apparent from TABLE 3, the higher the fluoric acid density of the etching solution, the shorter the etching time. Nevertheless, it was found that the individual micro-lens arrays (30') obtained at the fluoric acid densities of the etching solutions are substantially identical to each other in both size and shape. This means that the formation method according to the present invention does not depend on the density of an etchant component (fluoric acid) contained in the etching solution. In other words, it is unnecessary to severely and strictly control the etchant density of the etching solution and the etching time to uniformly and equally form a finely-structured part.

Especially, this feature is significant in a case where a plurality of uniform finely-structured parts are formed in a large-sized glass substrate. In particular, it is necessary to prepare a large etching cell before the large-sized glass substrate can be subjected to the etching process, and it is very difficult to uniformly distribute the etchant density in the etching solution, held in the large etching cell, over the whole time period of the etching process. Nevertheless, in the formation method according to the present invention, it is unnecessary to uniformly control the etchant density distribution of the etching solution, because the etching of the large-sized glass substrate can be automatically and properly stopped regardless of the variation in the etchant density distribution of the etching solution.

As stated above, in the first embodiment, during the isotropic etching process, the temperature of the etching solution 38 is maintained at 20° C. Also, there is a close relationship between the temperature of the etching solution 38 and the etching time measured from the immersion of a glass substrate 30 to the stoppage of the etching of the glass substrate 30.

The inventors carried out experiments to investigate a relationship between the temperature of the etching solution and the etching time. The experimental results are shown in the following TABLE 4:

TABLE 4

| | TM | | |
|---|---|---|---|
| | 20° C. | 30° C. | 40° C. |
| ET | 15 min. | 12 min. | 10 min. |

In TABLE 4, reference TM indicates the temperature of the etching solution, and reference ET indicates the etching time.

Note that the experiments were carried out under the same conditions as the first embodiment except that the temperature of the etching solution were varied as shown in TABLE 4.

As is apparent from TABLE 3, the higher the temperature of the etching solution, the shorter the etching time. Nevertheless, it was found that the individual micro-lens arrays (30') obtained at the temperatures of the etching solutions are substantially identical to each other in both size and shape. This means that the formation method according to the present invention does not depends on the temperature of the etching solution. In other words, it is unnecessary to severely and strictly control the temperature of the etching solution and the etching time to uniformly and equally form a finely-structured part.

This feature is also significant in the case where the plurality of uniform finely-structured parts is formed in the large-sized glass substrate. Although it is very difficult to maintain the temperature distribution of the etching solution to be constant in the large etching cell over the whole time period of the etching process, according to the present invention, it is unnecessary to control the temperature distribution of the etching solution to be constant, because the etching of the large-sized glass substrate can be automatically and properly stopped regardless of the variation in the temperature of the etching solution.

As stated above, in the first embodiment, the mask (chromium) layer 32 has the thickness of 100 nm. The thickness of the mask layer 32 forms one of the significant factors of the formation method according to the present invention. So, the inventors carried out experiments to investigate a suitable thickness of the mask layer. The experimental results are shown in the following TABLE 5:

TABLE 5

| | TML | | | | | |
|---|---|---|---|---|---|---|
| | 10 nm | 20 nm | 50 nm | 100 nm | 300 nm | 500 nm |
| ETS | x | o | o | o | o | x |

In TABLE 5, reference TML indicates the thickness of the mask layer (32), and reference ETS indicates the etched-state of the glass substrate (30). Reference o represents that the etched-state of the glass substrate (30) could be acceptable, and reference x represents that the etched-state of the glass substrate (30) was unacceptable.

Note that the experiments were carried out under the same conditions as the first embodiment except that the thickness of the mask layer (32) was varied as shown in TABLE 5.

When the thickness of the mask layer (32) was smaller than 10 nm, the mask layer could not fulfill its masking function due to production of pin holes in the mask layer, and exfoliation of the mask layer (32) was also observed. Thus, the etched-state of the glass substrate (30) was unacceptable. On the other hand, when the thickness of the mask layer (32) was larger than 500 nm, the mask layer (32) also could not fulfill its masking function due to production of cracks in the mask layer (32). It may be supposed that the production of the cracks results from residual stresses in the mask layer (32). Of course, the etched-state of the glass substrate (30) was unacceptable.

Thus, as is apparent from TABLE 5, the thickness of the mask layer (32) should be selected from a range from about 20 nm to about 300 nm before the etched-state of the glass substrate (30) can be obtained as an acceptable state.

In the first embodiment, although the mask layer 32 is made of chromium exhibiting both excellent adherability to the glass substrate 30 and excellent resistance to the etching solution 38, another suitable material, such as silicon, titanium, silver, platinum, gold or the like may be used for the mask layer 32. When the mask layer 32 is made of one of the materials except for the chromium, it is preferable to select the thickness of the mask layer from the range between about 20 nm and about 300 nm to ensure the acceptable etched-state of the glass substrate.

As stated above, in the first embodiment, the resist layer 34 has the thickness of 1,000 nm. The thickness of the resist layer 34 also forms one of significant factors of the formation method according to the present invention. So, the inventors carried out experiments to investigate a suitable thickness of the resist layer. The experimental results are shown in the following TABLE 6:

TABLE 6

| | TRL | | | | | | |
|---|---|---|---|---|---|---|---|
| | 100 nm | 200 nm | 500 nm | 1000 nm | 2000 nm | 4000 nm | 6000 nm |
| ETS | x | o | o | o | o | o | x |

In TABLE 6, reference TRL indicates the thickness of the resist layer (34), and reference ETS indicates the etched-state of the glass substrate (30). Reference o represents that the etched-state of the glass substrate (30) could be acceptable, and reference x represents that the etched-state of the glass substrate (30) was unacceptable.

Note that the experiments were carried out under the same conditions as the first embodiment except that the thickness of the resist layer (34) was varied as shown in TABLE 6.

When the thickness of the resist layer (34) was smaller than 100 nm, or when the thickness of the resist layer (34) is larger than 6,000 nm, exfoliation of the mask layer (32) was observed. The causes of the exfoliation of the mask layer (32) could not be cleared up. Of course, the etched-state of the glass substrate (30) was absolutely unacceptable. Thus, as is apparent from TABLE 6, the thickness of the resist layer (34) should be selected from a range from about 200 nm to about 4,000 nm before the etched-state of the glass substrate (30) can be obtained as an acceptable state.

In the aforesaid first embodiment, although both aluminum oxide and barium oxide are used in the glass substrate 30 as the etching-control component, the glass substrate 30 may contain only one of aluminum oxide and barium oxide as the etching-control component. Also, as the etching-control component, it is possible to use another oxide, such as magnesium oxide, calcium oxide, potassium oxide, strontium oxide, lithium oxide, sodium oxide, cesium oxide, or the like. Of course, these oxides react with fluoric acid to produce insoluble matter, such as magnesium fluoride, calcium fluoride, potassium fluoride, strontium fluoride, lithium fluoride, sodium fluoride, and cesium fluoride.

In short, at least one or more than one of aluminum oxide, magnesium oxide, calcium oxide, potassium oxide, strontium oxide, barium oxide, lithium oxide, sodium oxide, cesium oxide or the like as the etching-control component may be used as the etching-control component.

Also, in the aforesaid first embodiment, although non-alkali glass is used for the glass substrate 30, it is possible to make the glass substrate 30 of another glass material, such as alkali borosilicate glass, borosilicate glass, lead glass, β-quartz type transparent glass ceramic or the like. Of course, these glass material must contain a predetermined amount of etching-control component before the etching of the glass substrate (30) can be properly controlled. Note, as well known, the non-alkali glass, the alkali borosilicate glass, the borosilicate glass, the lead glass, and the β-quartz type transparent glass ceramic are relatively inexpensive in comparison with a quartz glass and a silicon wafer which are frequently used as a substrate in a conventional formation method for forming a finely-structured part.

Further, in the aforesaid first embodiment, although the etching solution 38 is composed of the fluoric acid solution, another fluoric-acid-based etching solution, such as a buffered fluoric acid etching solution containing fluoric acid and ammonium fluoride, a fluoric-nitric acid etching solution containing fluoric acid and nitric acid or the like may be used for the etching solution 38.

Furthermore, in the aforesaid first embodiment, it is possible to make the glass substrate 30 of oxyhalide glass which may contain an insoluble-matter component, such as one of calcium fluoride, potassium fluoride, barium fluoride, aluminum fluoride, strontium fluoride, magnesium fluoride or the like. In this case, during the etching process, since the insoluble-matter itself is separated out of the oxyhalide glass substrate, it is possible to control the etching of the oxyhalide glass substrate in substantially the same manner as mentioned above.

As stated above, the glass substrate 30 inevitably contains the impurities (1%). During the etching process, the impurities may be separated out of the glass substrate 30 as the insoluble-matter in the etching solution 38. Thus, as the etching of the glass substrate 30 is influenced by the amount of impurities contained in the glass substrate 30, the impurities of the glass substrate 30 must be taken into account before the etching of the glass substrate 30 can be properly and precisely controlled. For example, when some glass substrates (30) are immersed at once in the etching solution 38 so as to be simultaneously subjected to the etching process, these glass substrates should be made of a batch of glass material homogeneously containing the impurities, before the glass substrates can be uniformly and equally etched.

As stated above, since the etching of the glass substrate 30 is automatically stopped, it is unnecessary to strictly control a timing at which the glass substrate 30 should be taken out of the etching solution 38. Namely, in the formation method according to the present invention, the etching time is not defined as the immersion time when the glass substrate is immersed in the etching solution 38, as already stated.

Figure 5A:
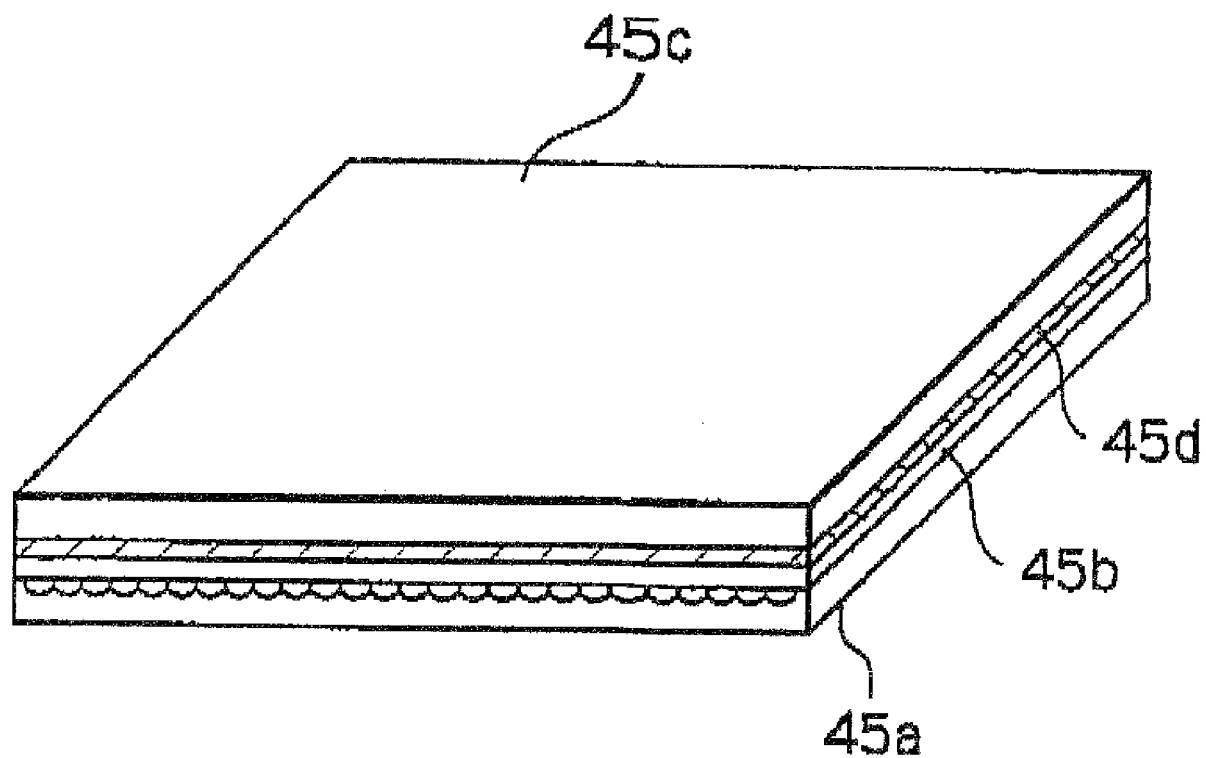
FIG. 5A is a perspective view of a liquid crystal display having the micro-lens array formed by the formation method shown in FIGS. 4A to 4F.

FIG. 5A shows a liquid crystal display having a micro-lens array formed by the first embodiment of the formation method according to the present invention, and FIGS. 5B to 5J show representative steps of a process for manufacturing the liquid crystal display.

In FIG. 5A, the micro-lens array is indicated by reference 45a, and the micro-lens array 45a has a glass plate spacer 45b. The liquid crystal display includes a TFT (thin film transistor) substrate 45c, and is combined with the micro-lens array 45a such that a liquid crystal layer 45d is defined there between. The liquid crystal display may be manufactured according to the process as shown by way of example in FIGS. 5B to 5J.

Figure 5B:
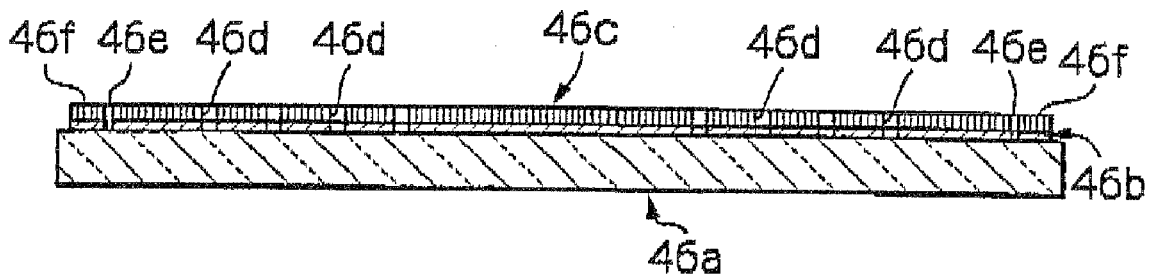
FIG. 5B is a conceptual explanatory view showing a representative step of a manufacturing process for manufacturing a plurality of liquid crystal displays as shown in FIG. 5A.

First, as shown in FIG. 5B, a large-sized glass substrate 46a having a thickness of 0.7 mm is prepared to simultaneously produce a plurality of micro-lens arrays (45a), and features substantially the same percentage composition as the glass substrate 30 used in the first embodiment. Then, a mask layer 46b and a positive type resist layer 46c are formed in order on the glass substrate 46a in substantially the same manner as the mask layer 32 and 34 in the first embodiment, and have thicknesses of 100 nm and 1,000 nm, respectively. Note, similar to the first embodiment, the mask layer 46b is formed as a chromium layer.

Thereafter, as shown in FIG. 5B, using a photolithography process and an etching process, plural arrays of circular openings 46d are formed in both the mask layer 46b and the resist layer 46c in substantially the same manner as the array of openings 46d in the first embodiment. Each of the circular openings 46d has a diameter 3 μm, and an array pitch in each array of circular openings 46d is 30 μm.

When the plural arrays of circular openings 46d are formed in both the mask layer 46b and the resist layer 46c, slits 46e are simultaneously formed in both the mask layer 46b and the resist layer 46c such that a positioning mark areas 46f is defined on resist layer 46c so as to be located at a predetermined position in a margin area of each array of circular openings 46d (FIG. 5B). Namely, the positioning mark area 46f represents a position of the corresponding array of circular openings 46d on the glass substrate 46a.

Figure 5C:
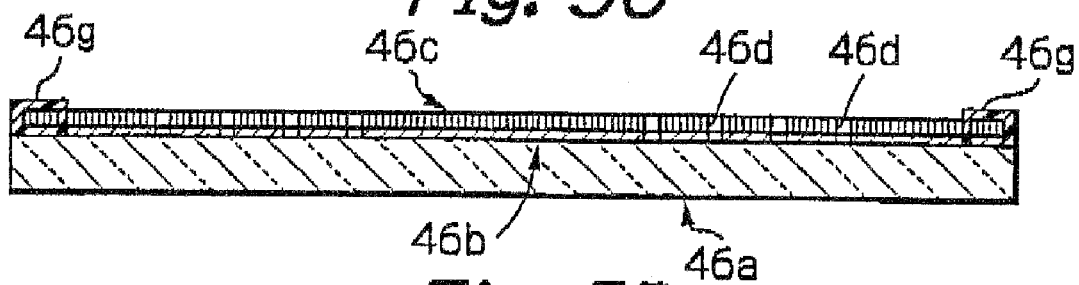
FIG. 5C is a conceptual explanatory view showing another representative step of the manufacturing process for the liquid crystal displays.
Figure 5D:
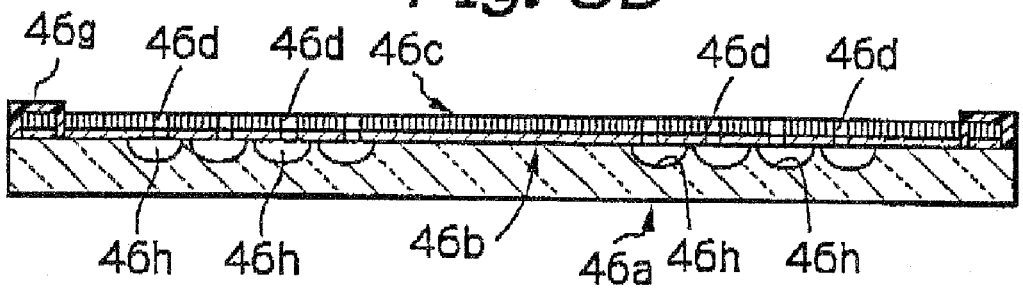
FIG. 5D is a conceptual explanatory view showing yet another representative step of the manufacturing process for the liquid crystal displays.

Subsequently, as shown in FIG. 5C, each of the positioning mark area 46f is covered with a suitable protective resin material 46g, such as epoxy or the like. Alternatively, it is possible to substitute a protective adhesive tape for the protective resin material 46g. Then, similar to the first embodiment, the glass substrate 46a carrying both the layers 46b and 46c is subjected to an isotropic etching process by immersing it in an etching solution composed of an aqueous solution containing 10% fluoric acid as an etchant component, and the etching of the glass substrate is automatically stopped as explained in the first embodiment. Thus, plural arrays of hemisphere-like recesses 46h are formed in the glass substrate 46a, as shown in FIG. 5D.

Figure 5E:
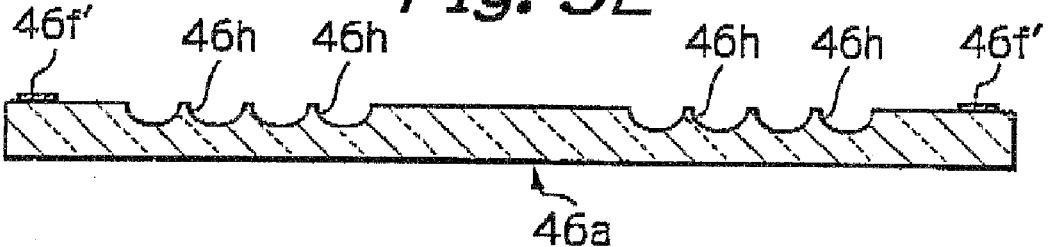
FIG. 5E is a conceptual explanatory view showing still yet another representative step of the manufacturing process for the liquid crystal displays.

After the etching of the glass substrate 46a is stopped, the glass substrate 46a is taken out of the etching solution, and is processed with acetone to thereby remove the resist layer 46c therefrom. Subsequently, the glass substrate 46a is further processed with the chromium-etching solution to thereby remove the mask layer 46b therefrom. Then, the protective resin materials 46g are removed together with the resist material from the glass substrate 46a, so that positioning marks 46f' corresponding to the positioning mark areas 46f are left on the surface of the glass substrate 46a, as shown in FIG. 5E.

Figure 5F:
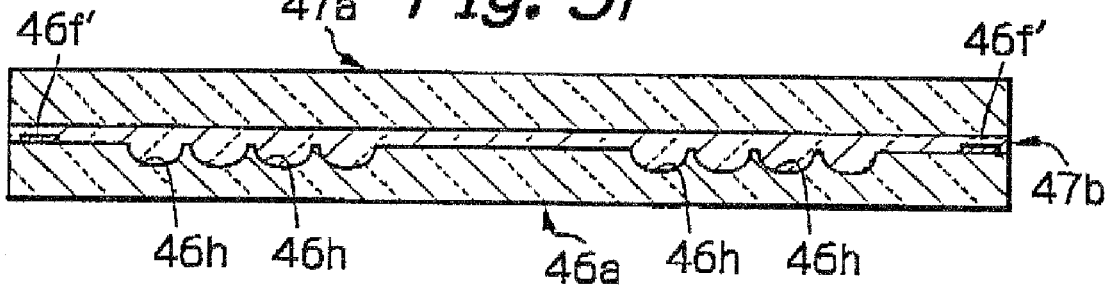
FIG. 5F is a conceptual explanatory view showing still yet another representative step of the manufacturing process for the liquid crystal displays.

Thereafter, as shown in FIG. 5F, a suitable transparent adhesive agent having a high refractive index is applied to the recess-side surface of the glass substrate 46a such that all the hemisphere-like recesses 46h are filled with the transparent adhesive agent, and a large-sized glass plate spacer 47a is adhered to the recess-side surface of the glass substrate 46a to thereby form a transparent adhesive agent layer 47b there between, with each array of hemisphere-like recesses 46h defining a micro-lens array (45a) together with a corresponding section of the transparent adhesive agent layer 47b.

Alternately, all the hemisphere-like recesses 46h of the glass substrate 46a may be previously filled with a suitable transparent material having a high refractive index. In this case, the glass plate spacer 47a is adhered to the recess-side surface of the glass substrate 46a, using a transparent adhesive agent having substantially the same refractive index that of the glass plate spacer 47a.

Figure 5G:
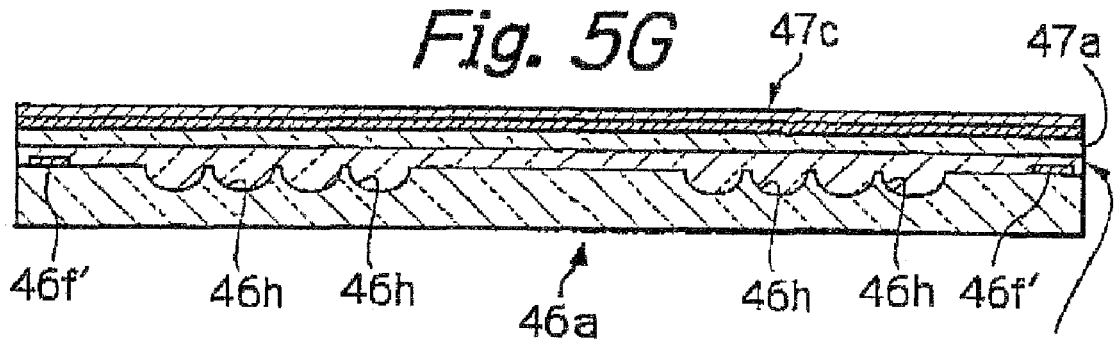
FIG. 5G is a conceptual explanatory view showing still yet another representative step of the manufacturing process for the liquid crystal displays.

Then, a thickness of the glass plate spacer 47a is adjusted such that a focal point of each micro-lens is brought to an aperture formed in a corresponding pixel area when the assembly are completed to produce a plurality of liquid crystal displays (FIG. 5A). After the adjustment of the thickness of the glass plate spacer 47a, as shown in FIG. 5G, an optical shield layer 47c composed of a suitable metal material, such as chromium, aluminum or the like, is formed on the surface of the adjusted glass plate spacer 47a by a sputtering process.

Figure 5H:
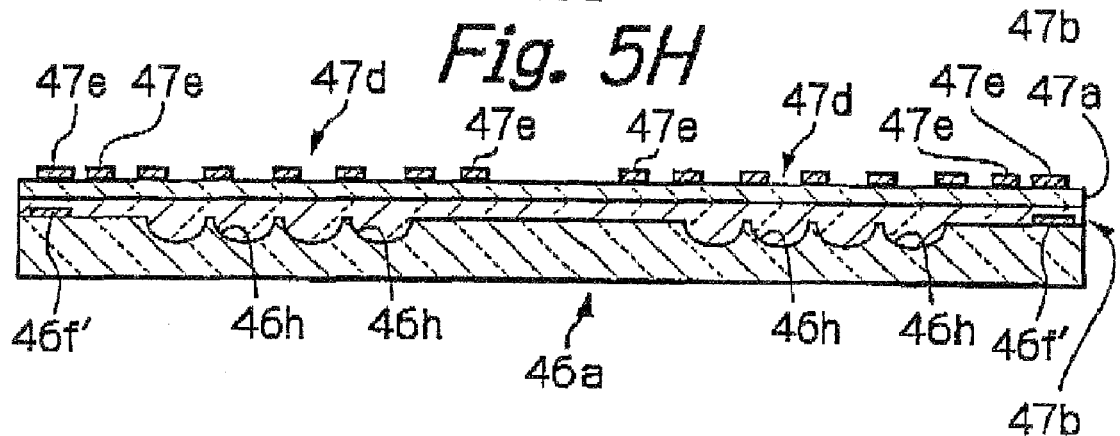
FIG. 5H is a conceptual explanatory view showing still yet another representative step of the manufacturing process for the liquid crystal displays.

Subsequently, as shown in FIG. 5H, the optical shield layer 47c is patterned by a photolithography process and an etching process such that plural arrays of pixel areas, generally indicated by reference 47d, are formed in the optical shield layer 47c. Also, when the formation of the arrays of pixel areas 47d is performed, register marks 47e are simultaneously formed in the optical shield layer 47c. It is possible to precisely perform both the formation of each array of pixel areas 47d and formation of the corresponding register mark 47e due to the existence of the positioning mark 46f'. Note, in FIG. 5H, although each register mark 47e is illustrated as if it is just above the corresponding positioning mark 46f' for the sake of convenience of illustration, in reality, the register mark 47c is positioned such that the positioning mark 46f' is can be observed through the glass plate spacer 47a.

Thereafter, although an array of transparent electrodes, a liquid-crystal-molecule alignment layer and so on are formed in order on each array of pixel areas 47d in conventional manners, these elements are omitted from FIG. 5H, to avoid complexity of illustration.

Figure 5I:
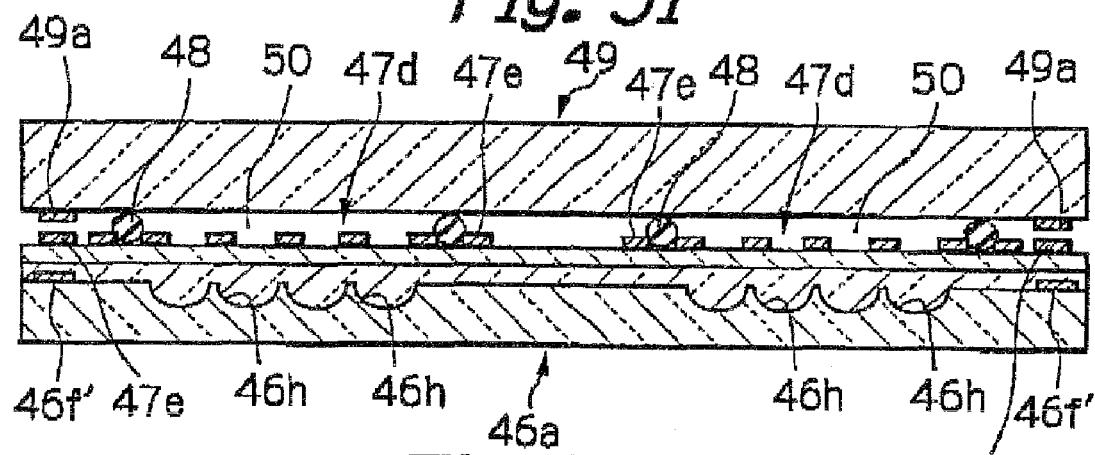
FIG. 5I is a conceptual explanatory view showing still yet another representative step of the manufacturing process for the liquid crystal displays.

Then, as shown in FIG. 5I, rectangular frame spacer seals 48 are printed and formed on the glass plate spacer 47a such that the respective arrays of pixel areas 47d are encompassed by the rectangular frame spacer seals 48, and a large-sized TFT (thin film transistor) substrate 49 having plural arrays of transparent electrodes (not shown) is combined with the glass substrate 46a carrying the glass plate spacer 47a, such that each array of transparent electrodes is registered with a corresponding array of pixel areas 47d. As shown in FIG. 5I, a space 50 for enclosing a suitable liquid crystal is defined by each rectangular spacer seal 48 between the glass plate spacer 47a and the TFT substrate 49. Note, the TFT substrate 49 can be produced in conventional manners, and each transparent electrode is associated with a TFT transistor which serves as a switching element for selectively applying a voltage to the transparent electrode.

As shown in FIG. 5I, the TFT substrate 49 are provided with register marks 49a formed thereon at predetermined locations, and the respective register marks 49a are arranged so as to be cooperated with the register marks 47e formed on the glass plate spacer 47a. Namely, in the combination of the TFT substrate 49 with the glass substrate 46a carrying the glass plate spacer 47a, it is possible to precisely and properly register the respective arrays of transparent electrodes with the corresponding arrays of pixel areas 47d by aligning the respective register marks 49a with the register marks 47e.

Figure 5J:
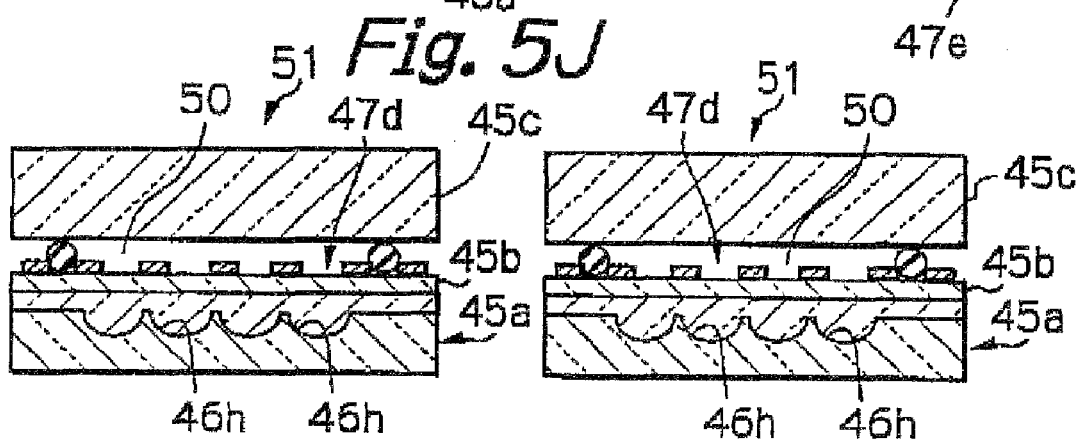
FIG. 5J is a conceptual explanatory view showing still yet another representative step of the manufacturing process for the liquid crystal displays.

Thereafter, as shown in FIG. 5J, the assembly comprising the combined glass substrate 46a and TFT substrate 49 is divided into sections 51, each of which forms the liquid crystal display as shown in FIG. 5A. Of course, the liquid crystal must be enclosed in the space 50 of each section 51 to thereby form a liquid crystal layer 45d, before each section 51 can be used as the liquid crystal display. Note, the liquid crystal may be enclosed in the spaces 50 before the assembly comprising the combined glass substrate 46a and TFT substrate 49 is divided into the sections 51.

Figure 5K:
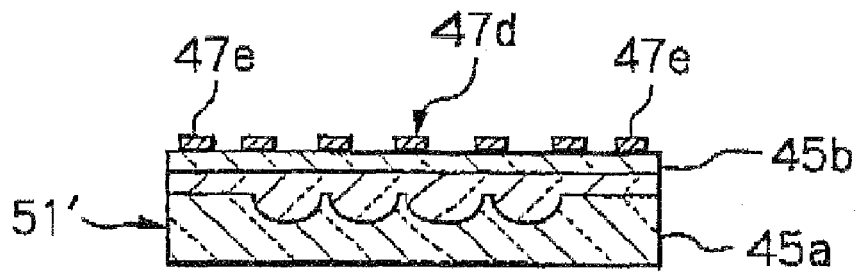
FIG. 5K is a conceptual explanatory view showing a representative step of a first modification of the manufacturing process shown in FIGS. 5B to 5J.
Figure 5L:
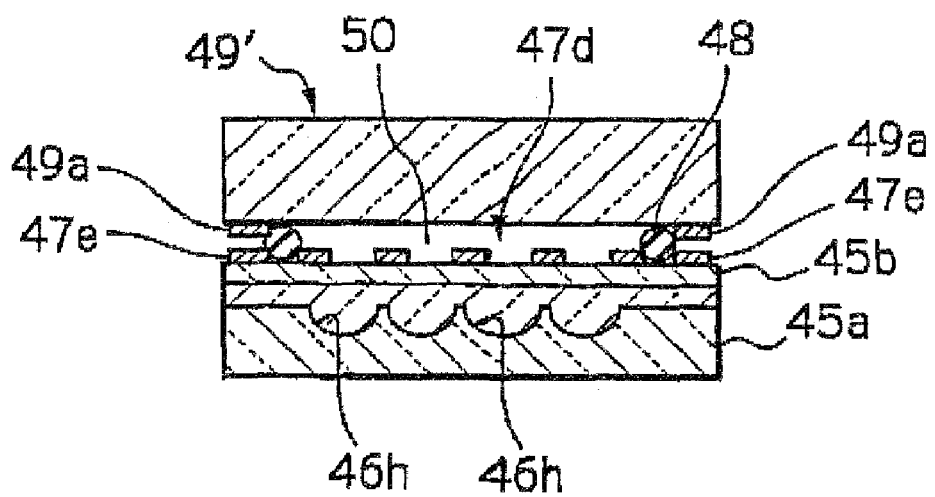
FIG. 5L is a conceptual explanatory view showing another representative step of the first modification of the manufacturing process shown in FIGS. 5B to 5J.

In the aforesaid process for manufacturing the liquid crystal display, after the step shown in FIG. 5H, the glass substrate 46a carrying the glass plate spacer 47a may be divided into sections 51', one of which forms a micro-lens array 45a carrying a glass plate spacer 45b, as shown in FIG. 5K. In this case, a TFT (thin film transistor) substrate 49' having an array of transparent electrodes (not shown) is combined with the divided section 51', as shown in FIG. 5L, such that a rectangular frame spacer seal 48 is intervened there between, as shown in FIG. 5L.

Namely, the array of pixel areas 47d is encompassed by the rectangular frame spacer seal 48, and a space 50 for enclosing a suitable liquid crystal is defined by the rectangular spacer seal 48 between the glass plate spacer 45b and the TFT substrate 49'. Thereafter, a liquid crystal is enclosed in the space 50, resulting in production of a liquid crystal display as shown in FIG. 5A.

Figure 5M:
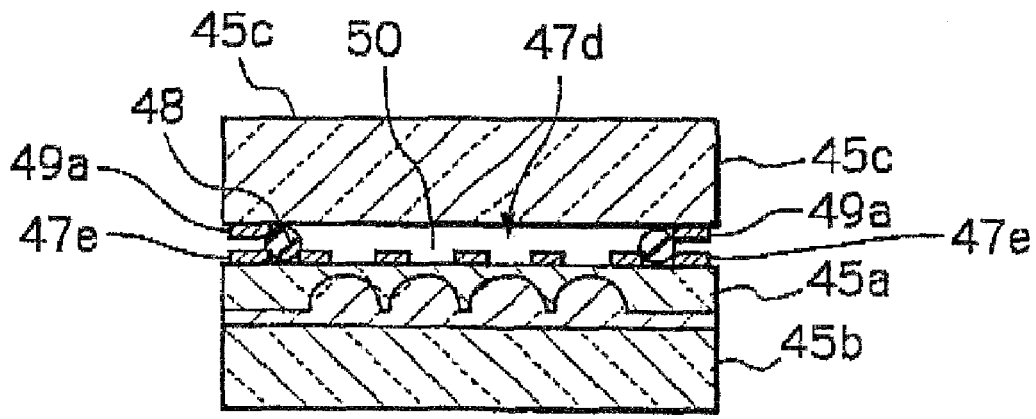
FIG. 5M is a conceptual explanatory view showing a representative step of a second modification of the manufacturing process shown in FIGS. 5B to 5J.

Also, in the aforesaid process for manufacturing the liquid crystal display, after the step shown in FIG. 5F, the arrays of pixel areas 47d may be formed on the flat surface of the glass substrate 46a, so that the liquid crystal display is constituted as shown in FIG. 5M. In this case, the glass plate spacer 47a (45b) serves as a lining plate for reinforcing the glass substrate 46a (and therefore, the micro-lens array 45a). Also, as is apparent from FIG. 5M, a thickness of the glass substrate 46a is adjusted such that the focal point of each micro-lens is brought to the aperture formed in the corresponding pixel area.

In the aforesaid process for manufacturing the liquid crystal display, it is preferable that the micro-lens array substrate has a coefficient of linear thermal expansion which is close to that of the TFT substrate, to thereby prevent exfoliation of the micro-lens array substrate from the TFT substrate based on the thermal expansion difference there between. As well known, the TFT substrate is frequently made of either a non-alkali glass or quartz glass. Of course, when the TFT substrate is made of non-alkali glass, the micro-lens array substrate should be made of inexpensive non-alkali glass. Also, when the TFT substrate is made of expensive quartz glass, $\beta$-quartz type transparent glass ceramic can be used for the micro-lens array.

Figure 6:
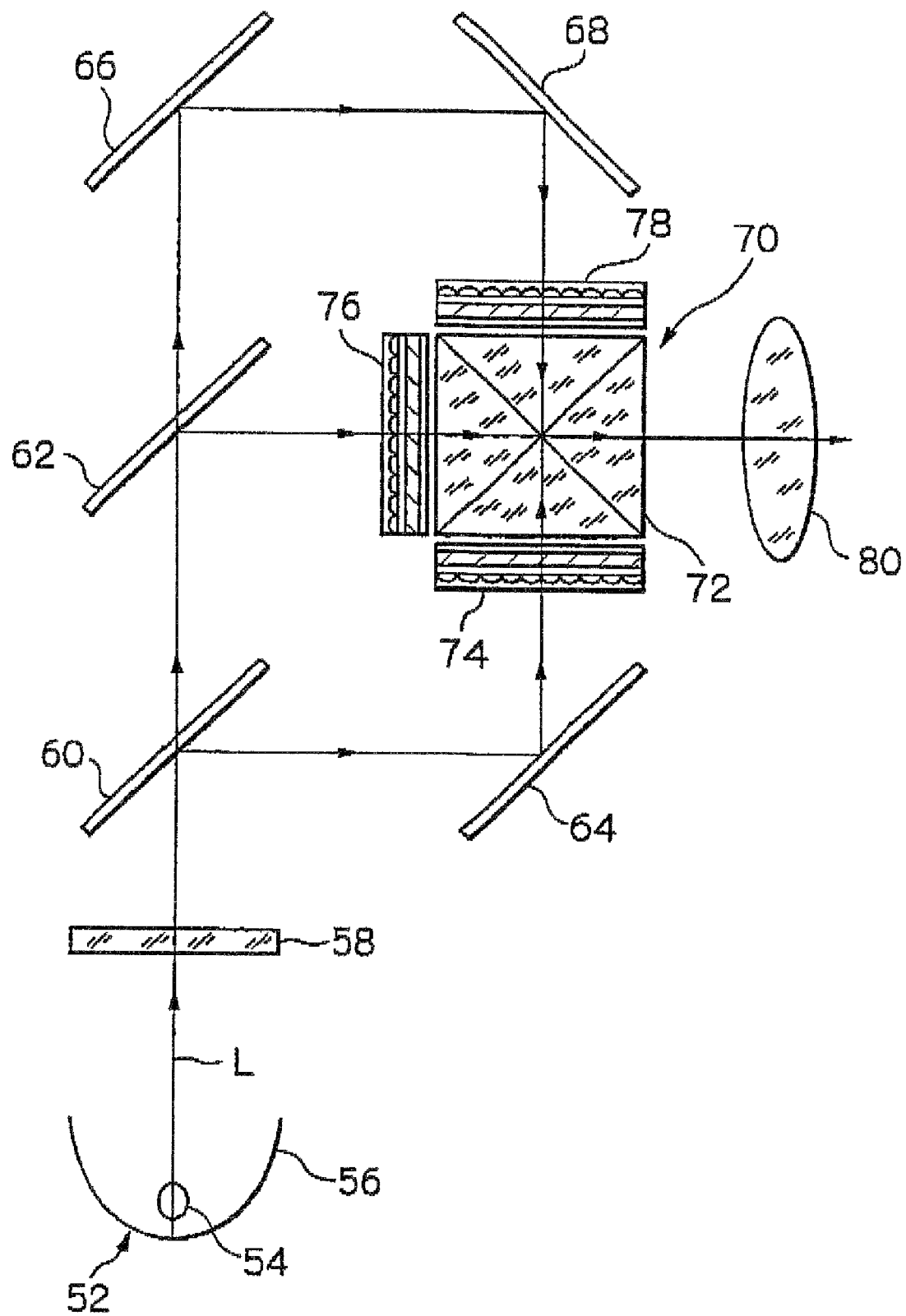
FIG. 6 is a schematic conceptual view of a liquid crystal projector using the liquid crystal display of FIG. 5 as a light valve device.

FIG. 6 schematically and conceptually shows a liquid crystal projector using the aforesaid liquid crystal display as a light valve device.

As illustrated, the liquid crystal projector includes a white light source 52 having a white lamp 54 and a concave reflector 56, and an optical polarization converter and integrator 58. The white lamp 53 emits light rays, and the light rays are gathered by the concave reflector 56 so as to be directed to the optical polarization converter and integrator 58. In FIG. 6, the gathered light rays are represented by a white light L emerged from the light source 52, and the white light L is composed of red, green and blue light components. While the light L passes through the optical polarization converter and integrator 58, the white light L is uniformly polarized, and an intensity distribution of the light L is made even.

The liquid crystal projector also includes an optical color-separation system having a first dichroic mirror 60 and a second dichroic mirror 62, and an optical reflection system having a first total reflector 64, a second total reflector 66, and a third total reflector 68, and an optical color-image synthesizing system 70 associated with both the optical color-separation system and the optical reflection system.

The color-image synthesizing system 70 includes a cross-dichroic prism 72 having three light-incident faces and a light-emission face; first, second and third light valve devices 74, 76 and 78 associated with to the respective light-incident faces of the cross-dichroic prism 72; and a projecting lens system 80 associated with the light-emission face of the cross-dichroic prism 72.

Note, although not shown in FIG. 6, a polarizing filter is applied to each of the light-incident faces of the cross-dichroic prism 72, and is constituted such that the light L, uniformly polarized by the polarization converter and integrator 58, is blocked.

As shown in FIG. 6, the white light L, emerged from the optical polarization converter and integrator 58, is made incident on the first dichroic mirror 60, and only the red light component of the white light L is reflected by the first dichroic mirror 60. Namely, the red light component is separated from the white light L by the first dichroic mirror 60, and the remaining green and blue light components pass through the first dichroic mirror 60. The separated red light component is directed to the first total reflector 64, and is then reflected to the first light valve device 74.

On the other hand, the remaining green and blue light components passing through the first dichroic mirror 60 are made incident on the second dichroic mirror 62, and only the green light component is reflected by the second dichroic mirror 62. Namely, the green light component is separated by the second dichroic mirror 62, and is directed to the second light valve device 76. Also, the blue light component passing through the second dichroic mirror 62 is reflected by the second and third total reflectors 66 and 68, and is directed to the second light valve device 78.

Thus, the respective red, green and blue light components are made incident on the first, second and third light valve devices 74, 76 and 78, and are modulated by the light valve devices 74, 76 and 78 in accordance with three frames of red, green and blue image-pixel data. In particular, for example, each light valve element of the first light valve device 74 selectively polarizes a red light passing through it in accordance with a corresponding red image-pixel datum, such that only the selectively-polarized red light passes through the polarizing filter (not shown) applied to the corresponding light-incident face of the cross-dichroic prism 72. The same is true for the light valve devices 76 and 78 on which the respective green and blue light components are made incident. In short, the modulated red, green blue light components are synthesized in the cross-dichroic prism 72, and then are emitted from the light-emission face of the cross-dichroic prism 72 toward the projecting lens system 80, whereby a color image is projected and displayed on a screen (not shown).

In this liquid crystal projector, since each of the light valve devices 74, 76 and 78 is constituted as a liquid crystal display as shown in FIG. 5, i.e. since each light valve device features the micro-lens array 30', it is possible to increase an amount of light introduced into each light valve element or pixel area, whereby the projected color image can be distinctly observed in a relatively light environment.

Figure 7:
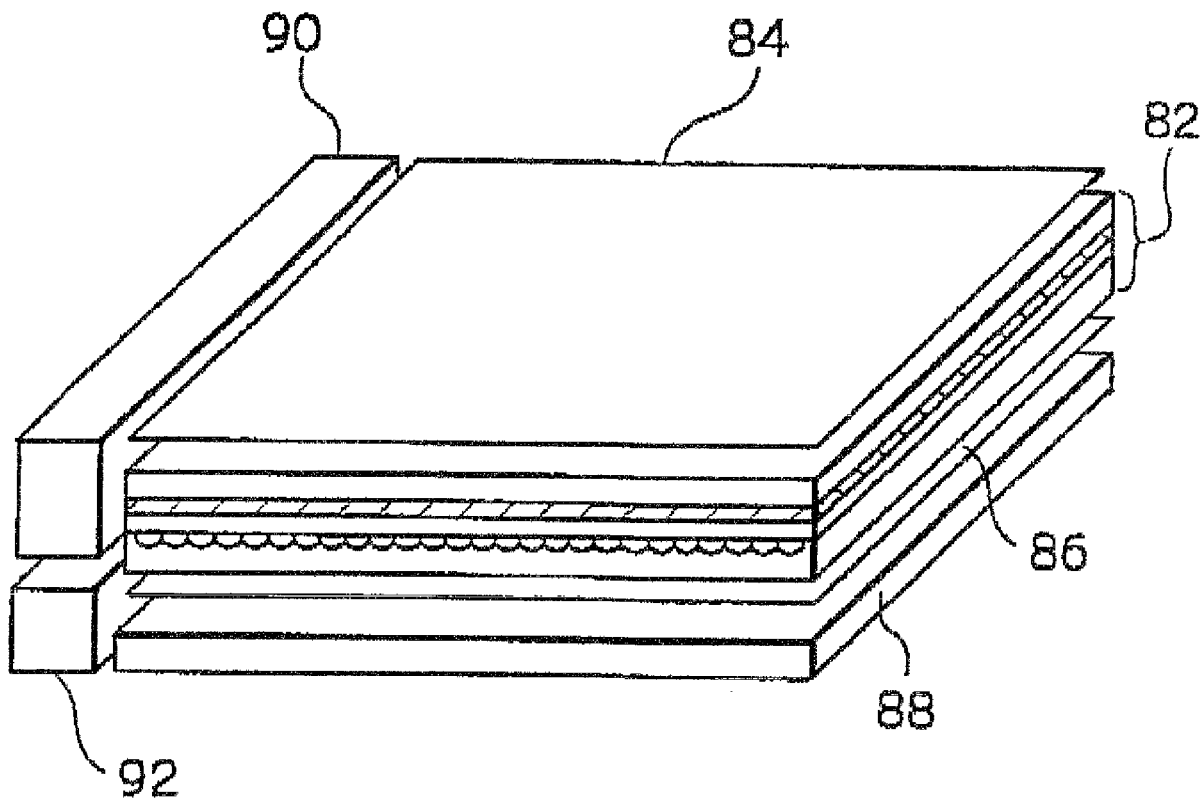
FIG. 7 is a perspective exploded view of a liquid crystal display apparatus using the liquid crystal display of FIG. 5.

FIG. 7 shows a liquid crystal display apparatus using the liquid crystal display shown in FIG. 5. Note, in this drawing, the liquid crystal display is indicated by reference 82.

The liquid crystal display 82 is sandwiched between two polarizing filters 84 and 96. Namely, the polarizing filter 84 is applied to the TFT substrate of the liquid crystal display 82, and the polarizing filter 86 is applied to the micro-lens array of liquid crystal display 82.

The liquid crystal display apparatus includes a back light unit 88 associated with the micro-lens array of the liquid crystal display 82 through the intermediary of the polarizing filter 86, a controller unit 90 for operating the liquid crystal display 82 and the back light unit 88, and an electric power source unit 92 for electrically energizing the liquid crystal display 82, the back light unit 88, and the control unit 92.

The back light unit 88 is constituted such that the polarizing filter 86 is cyclically illuminated with red, green and blue lights under control of the control unit 90 at a predetermined regular interval of time, and thus the polarized red, green and bluer lights are cyclically made incident on the micro-lens array of the liquid crystal display 82. The respective red, green and blue lights are cyclically modulated by the liquid crystal display 82 under the control of the control unit 90 in accordance with three frames of red, green and blue image-pixel data in substantially the same manner as mentioned above, whereby a color image can be distinctly observed through the polarizing filter 84 due to the existence of the micro-lens array.

In the liquid crystal display apparatus, a three-primary color filter may be incorporated in the liquid crystal display 82 to display the color image. In this case, the back light unit 88 is of course constituted such that the polarizing filter 86 is illuminated with a white light.

Furthermore, the liquid crystal display (FIG. 5) according to the present invention can be advantageously constituted as a semi-permeation type liquid crystal display, as disclosed in the aforesaid Patent Publication (KOKAI) No. 2000-298267.

Second Embodiment

Figure 8A:
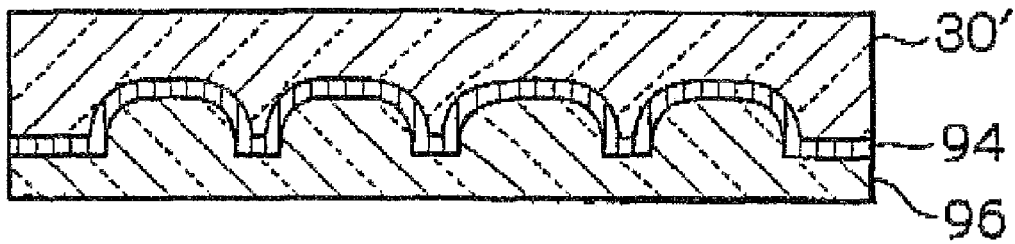
FIG. 8A is a conceptual explanatory view showing a representative step of a second embodiment of the formation method according to the present invention, to form another micro-lens array as a finely-structured part.
Figure 8B:
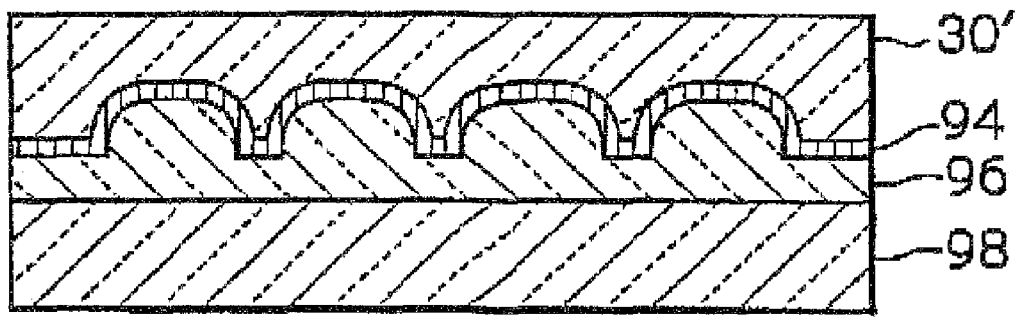
FIG. 8B is a conceptual explanatory view showing another representative step of the second embodiment of the formation method according to the present invention.
Figure 8C:
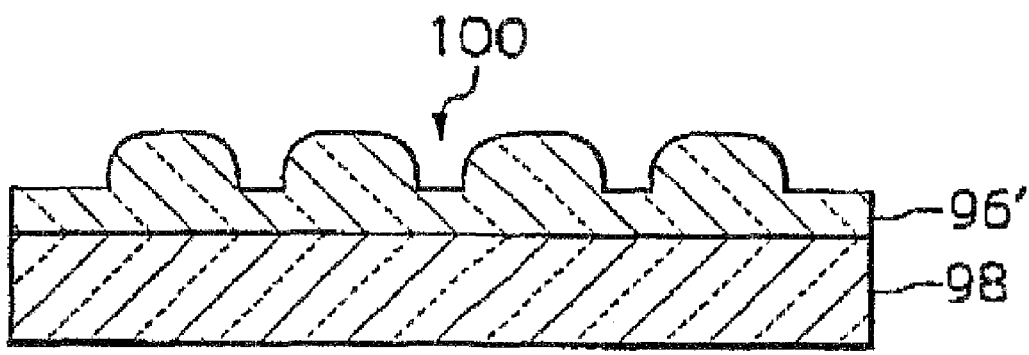
FIG. 8C is a conceptual explanatory view showing yet another representative step of the second embodiment of the formation method according to the present invention.

FIGS. 8A to 8C conceptually show representative steps of a second embodiment of the formation method according to the present invention, to form a micro-lens array as a finely-structured part. Note, in the second embodiment, the micro-lens array 30' (FIG. 4F) is used as a mold or matrix for molding the micro-lens array.

First, a molding face of the matrix 30' is coated with mold release agent to form a mold release agent layer 94, and then a suitable uncured transparent photo-curable resin is applied to the molding face of the matrix 30' to form a resin layer 96, as shown in FIG. 8A.

The matrix 30' carrying both the mold release agent layer 94 and the uncured resin layer 96 is placed on and pressed against a suitable glass substrate 98, thereby press-molding the uncured resin layer 96, as shown in FIG. 8B. Then, the micro-lens layer 96' is irradiated with ultraviolet rays to thereby cure the micro-lens layer 96' with the micro-lens layer 96' being securely adhered to the glass substrate 98.

Thereafter, the matrix 30' carrying the release agent layer 94 is removed such that the press-molded and cured resin layer 96 is left as a micro-lens layer 96' on the glass substrate 98, shown in FIG. 8C, resulting in production of a micro-lens array 100 including the micro-lens layer 96' and the glass substrate 98 (FIG. 8C).

In the second embodiment, although the micro-lens layer 96' is made of the photo-curable resin, another resin material, such as a suitable transparent heat-curable resin, a transparent two-component resin material composed of containing an initiator component and a resin component, or the like may be used for the micro-lens layer 96'.

Especially, when the micro-lens layer 96' is made of the heat-curable resin material, and when the matrix 30' has a large size, the glass substrate 98 should be made of a glass material having a coefficient of thermal expansion which is substantially equivalent to that of the matrix 30', because the micro-lens layer 96' may be subjected to thermal deformation based on the thermal expansion difference between the matrix 30' and the glass substrate 98. Thus, it is preferable to make the matrix 30' and the glass substrate 30' of the same glass material. As already stated above, since the matrix (micro-lens array) 30' is made of an inexpensive glass material, such as non-alkali glass, alkali borosilicate glass, borosilicate glass, and lead glass, it is possible to use the inexpensive glass material for the glass substrate 98.

Similar to the micro-lens array 30' (FIG. 4F), the micro-lens array 100 may assembled in an liquid crystal display as shown in FIG. 5. In this case, a suitable transparent adhesive agent having a low refractive index is applied to the micro-lens layer 96' of the micro-lens array 100, and then a glass plate spacer is adhered to the micro-lens layer 96' of the micro-lens array 100. The glass plate spacer has substantially the same function as the glass plate spacer 50 shown in FIG. 5. Namely, the micro-lens array 100 carrying the glass plate spacer can be assembled in the liquid crystal device in substantially the same manner as explained with reference to FIG. 5. Also, the micro-lens array 100 may be used in a liquid crystal display apparatus as shown in FIG. 7, and a semi-permeation type liquid crystal display as the aforesaid Patent Publication (KOKAI) No. 2000-298267.

In the second embodiment, the micro-lens array 100 is further subjected to a dry etching process as explained with reference to FIG. 2C. In this case, the micro-lens layer 96' serves as a mask layer, and the etching of the glass substrate 98 is controlled as if the micro-lens layer 96' is transferred to the glass substrate 98.

Third Embodiment

FIGS. 9A to 9D conceptually show representative steps of a third embodiment of the formation method according to the present invention, to form a planar light wave circuit device as a finely-structured part.

Figure 9A:
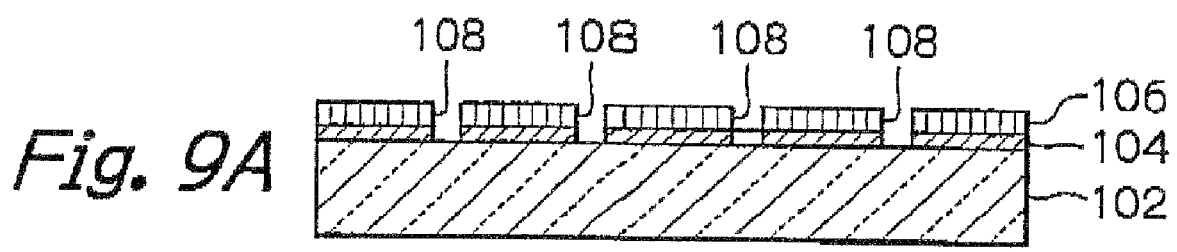
FIG. 9A is a conceptual explanatory view showing a representative step of a third embodiment of the formation method according to the present invention, to form a planar light wave circuit device as a finely-structured part.

In FIG. 9A, reference 102 indicates a non-alkali glass substrate having a suitable thickness. The glass substrate 102 features substantially the same percentage composition as the glass substrate 30 used in the first embodiment. Similar to the first embodiment, after the glass substrate 102 is rinsed, a chromium mask layer 104 having a suitable thickness is formed on the glass substrate 102 by a sputtering process, and then a positive type resist layer 106 having a suitable thickness is formed on the mask layer 104 by a spin-coat process.

Using a photolithography process, an imitative recess pattern corresponding to a light wave circuit pattern to be formed in the glass substrate 102 is formed in the resist layer 106, and the light wave circuit pattern includes optical light guide paths. Thus, the imitative recess pattern also includes imitative grooves corresponding to the optical light guide paths, and the imitative grooves are indicated by reference 108 in FIG. 9A.

Then, a chromium-etching solution composed of diammonium cerium nitrate as a main component is prepared, the glass substrate 102 carrying both the layers 104 and 106 is immersed in the chromium-etching solution, whereby the mask layer (chromium) 104 is etched such that the imitative grooves 108 are extended into the mask layer 104, as representatively shown in FIG. 9A.

Figure 9B:
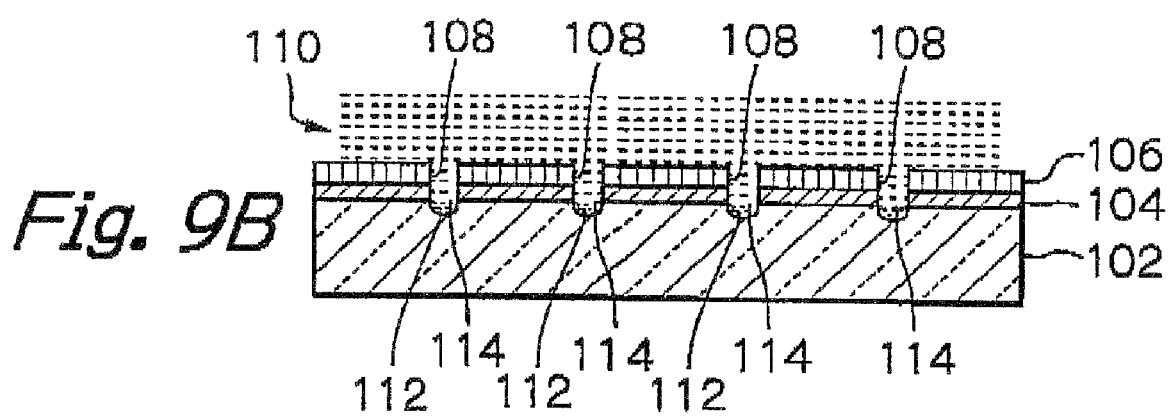
FIG. 9B is a conceptual explanatory view showing another representative step of the third embodiment of the formation method according to the present invention.

After the etching process of the mask layer 104, as shown in FIG. 9B, the glass substrate 102 carrying both the layers 104 and 106 is immersed in an etching solution 110, whereby the glass substrate 102 is subjected to an isotropic etching process. The etching solution 110 is composed of an aqueous solution containing fluoric acid as an etchant component, and is symbolically represented by a plurality of thick short bars in FIG. 9B. Thus, the glass substrate 102 is etched such that a recess pattern corresponding to the light wave circuit pattern is formed in the glass substrate 102. The recess pattern includes grooves corresponding to the optical light guide paths of the light wave circuit pattern, and these grooves are indicated by reference 112 in FIG. 9B.

Figure 9C:
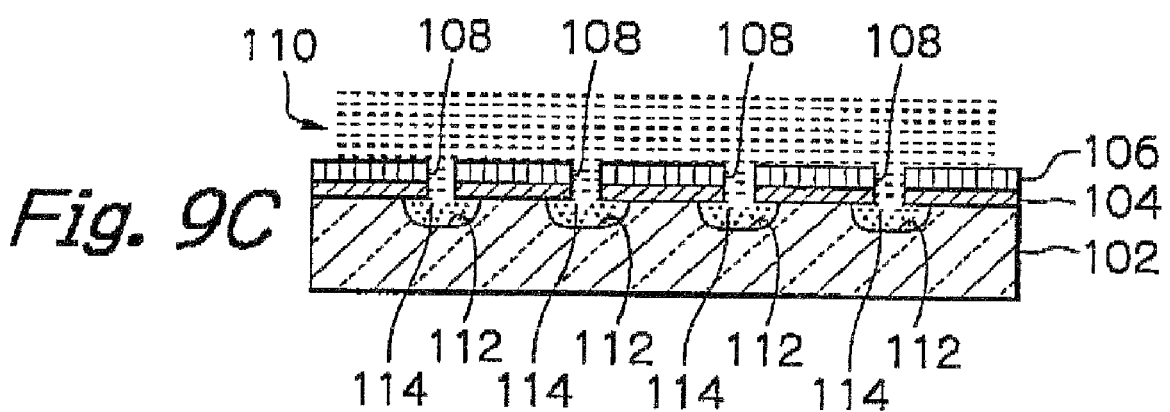
FIG. 9C is a conceptual explanatory view showing yet another representative step of the third embodiment of the formation method according to the present invention.

As shown in FIG. 9C, as the etching of the glass substrate 102 progresses, the recess pattern (112) becomes larger, because a fresh part of the etching solution 110 is introduced into the recess pattern (112). Nevertheless, as explained in the first embodiment, the etching of the glass substrate 102 is automatically stopped due to production of insoluble matter 114, which is symbolically represented by a plurality of small solid circles in FIGS. 9B and 9C. Of course, when the etching of the glass substrate 102 is stopped, the formation of the recess pattern (112) in the glass substrate 102 is finished, and the recess pattern (112) is equivalent to the light wave circuit pattern.

After the etching of the glass substrate 102 is stopped, the glass substrate 102 is taken out of the etching solution 110, and is processed with acetone to thereby remove the resist layer 106 therefrom. Subsequently, the glass substrate 102 is processed with the chromium-etching solution to thereby remove the mask layer 104 therefrom, and then the insoluble matter 114 is rinsed out of the recess pattern (112).

Figure 9D:
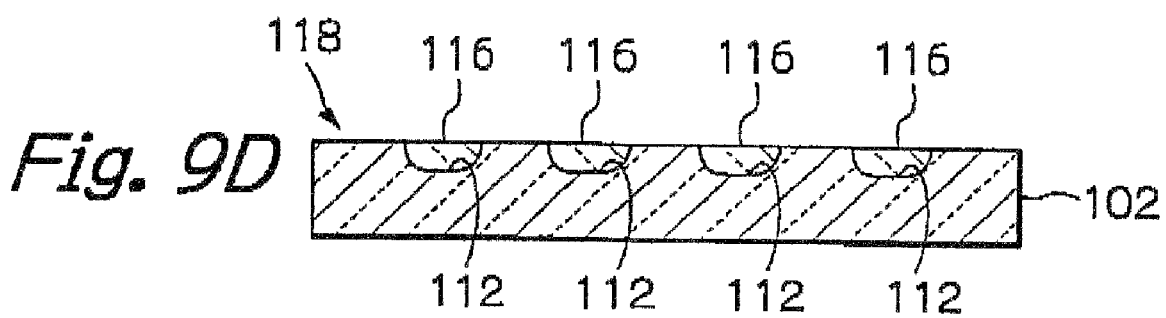
FIG. 9D is a conceptual explanatory view showing still yet another representative step of the third embodiment of the formation method according to the present invention.

Thereafter, as shown in FIG. 9D, the recess pattern (112), which is equivalent to the light wave circuit pattern, is filled with a suitable transparent material 116 having a high refractive index, resulting in production of a planar light wave circuit device 118.

Similar to the first embodiment, in the third embodiment, for example, by previously investigating a relationship between a width of the imitative grooves 108 and a width of the finished grooves 112, it is possible to easily determine the width of the imitative grooves 108 to be formed in the resist layer 104.

Note that the various modifications explained regarding the first embodiment may be applied to the third embodiment. Also, note that the various merits or advantages regarding the first embodiment are true for the third embodiment.

In the third embodiment, the glass substrate 102 having the finished recess pattern (112) may be used as a mold or matrix for forming a planar light wave circuit device. In this case, the light wave circuit device comprises a glass substrate on which a light wave circuit pattern is formed as a ridge-shape pattern having a high refractive index.

Fourth Embodiment

FIGS. 10A to 10E conceptually show representative steps of a fourth embodiment of the formation method according to the present invention, to form a buried-wiring substrate as a finely-structured part.

Figure 10A:
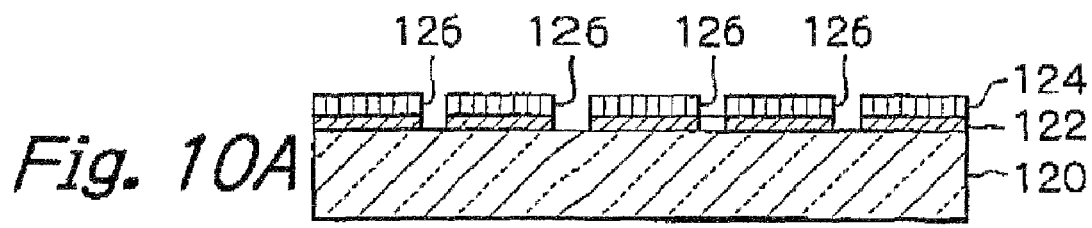
FIG. 10A is a conceptual explanatory view showing a representative step of a fourth embodiment of the formation method according to the present invention, to form a buried wiring substrate as a finely-structured part.

In FIG. 10A, reference 120 indicates a non-alkali glass substrate having a suitable thickness. The glass substrate 120 features substantially the same percentage composition as the glass substrate 30 used in the first embodiment. Similar to the first embodiment, after the glass substrate 120 is rinsed, a chromium mask layer 122 having a suitable thickness is formed on the glass substrate 122 by a sputtering process, and then a positive type resist layer 124 having a suitable thickness is formed on the mask layer 122 by a spin-coat process.

Using a photolithography process, an imitative recess pattern corresponding to a wiring circuit pattern to be buried in the glass substrate 120 is formed in the resist layer 124, and the wiring circuit pattern includes electrically conductive passages. Thus, the imitative recess pattern also includes imitative grooves corresponding to the electrically conductive passages, and the imitative grooves are indicated by reference 126 in FIG. 10A.

Then, a chromium-etching solution composed of diammonium cerium nitrate as a main component is prepared, the glass substrate 120 carrying both the layers 122 and 124 is immersed in the chromium-etching solution, whereby the mask layer (chromium) 122 is etched such that the imitative grooves 126 are extended into the mask layer 122, as representatively shown in FIG. 10A.

Figure 10B:
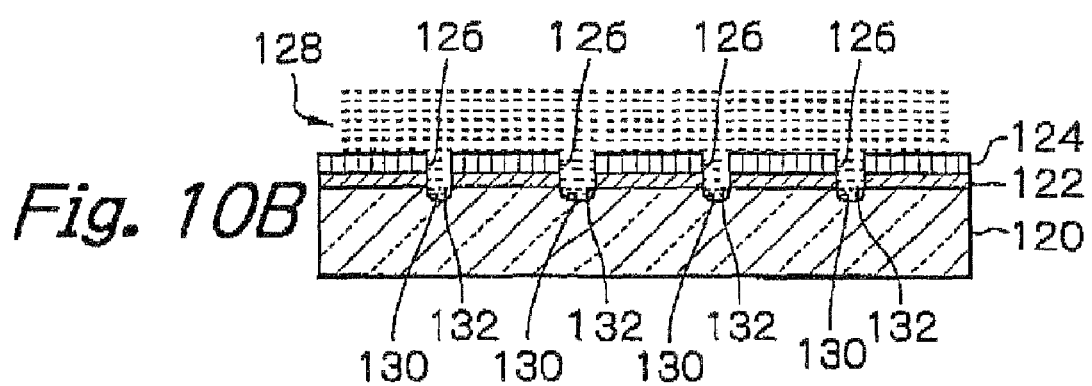
FIG. 10B is a conceptual explanatory view showing another representative step of the fourth embodiment of the formation method according to the present invention.

After the etching process of the mask layer 122, as shown in FIG. 10B, the glass substrate 120 carrying both the layers 122 and 124 is immersed in an etching solution 128, whereby the glass substrate 120 is subjected to an isotropic etching process. The etching solution 128 is composed of an aqueous solution containing fluoric acid as an etchant component, and is symbolically represented by a plurality of thick short bars in FIG. 10B. Thus, the glass substrate 120 is etched such that a recess pattern corresponding to the wiring circuit pattern is formed in the glass substrate 120. The recess pattern includes grooves corresponding to the electrically conductive passages of the wiring circuit pattern, and these grooves are indicated by reference 130 in FIG. 10B.

Figure 10C:
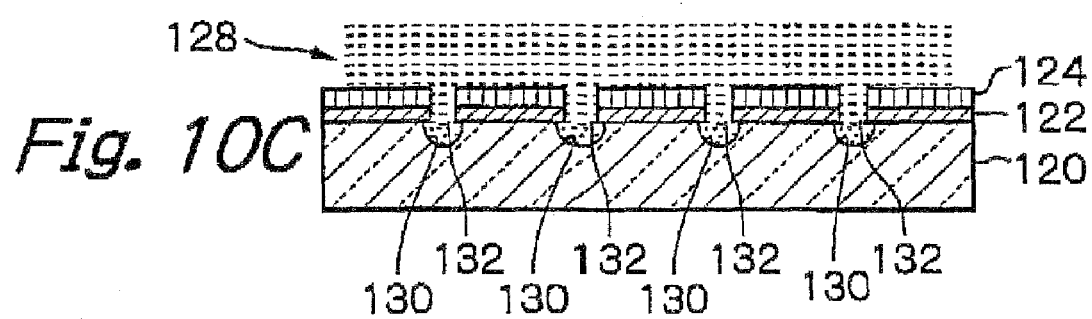
FIG. 10C is a conceptual explanatory view showing yet another representative step of the fourth embodiment of the formation method according to the present invention.

As shown in FIG. 10C, as the etching of the glass substrate 120 progresses, the recess grooves 130 become larger, because a fresh part of the etching solution 128 is introduced into the recess grooves 130. Nevertheless, as explained in the first embodiment, the etching of the glass substrate 120 is automatically stopped due to production of insoluble matter 132, which is symbolically represented by a plurality of small solid circles in FIGS. 10B and 10C. Of course, when the etching of the glass substrate 120 is stopped, the formation of the recess grooves 130 in the glass substrate 120 is finished, and the recess grooves 130 are equivalent to the wiring circuit pattern.

After the etching of the glass substrate 120 is stopped, the glass substrate 120 is taken out of the etching solution 128, and is processed with acetone to thereby remove the resist layer 124 therefrom. Subsequently, the glass substrate 120 is processed with the chromium-etching solution to thereby remove the mask layer 122 therefrom, and then the insoluble matter 132 is rinsed out of the recess grooves 130.

Figure 10D:
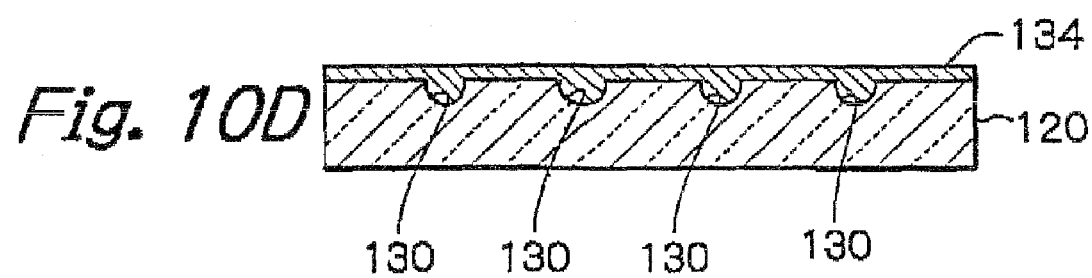
FIG. 10D is a conceptual explanatory view showing still yet another representative step of the fourth embodiment of the formation method according to the present invention.
Figure 10E:
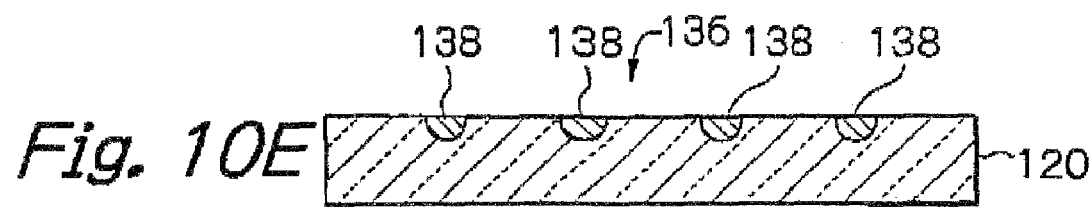
FIG. 10E is a conceptual explanatory view showing still yet another representative step of the fourth embodiment of the formation method according to the present invention.

Thereafter, as shown in FIG. 10D, a metal layer 134 is formed on the glass substrate by a sputtering process until the recess grooves 130 are sufficiently filled with the sputtered metal 136. Then, as shown in FIG. 10E, the metal layer 134 is eliminated from the surface of the glass substrate 120 by either a chemical process or a physical process, such that the metal materials are left in the recess grooves 130, resulting in production of a buried-wiring substrate 136. As is apparent from FIG. 10E, the buried-wiring substrate 136 has the buried-electrically-conductive passages 138 which form a part of the buried wiring pattern.

Similar to the first embodiment, in the fourth embodiment, for example, by previously investigating a relationship between a width of the imitative grooves 126 and a width of the recess grooves 130, it is possible to easily determine the width of the imitative grooves 126 to be formed in the resist layer 124.

Note that the various modifications explained regarding the first embodiment may be applied to the fourth embodiment. Also, note that the various merits or advantages regarding the first embodiment are true for the fourth embodiment.

Fifth Embodiment

FIGS. 11A to 11D conceptually show representative steps of a fifth embodiment of the formation method according to the present invention, to form a diffraction grating as a finely-structured part.

Figure 11A:
FIG. 11A is a conceptual explanatory view showing a representative step of a fifth embodiment of the formation method according to the present invention, to form a diffraction grating as a finely-structured part.

In FIG. 11A, reference 140 indicates a non-alkali glass substrate having a suitable thickness. The glass substrate 120 features substantially the same percentage composition as the glass substrate 30 used in the first embodiment. After the glass substrate 140 is rinsed, a photo-resist layer 142 having a suitable thickness is directly formed on the glass substrate 140 by a spin-coat process.

After the photo-resist layer 142 is dried, the photo-resist layer 142 is subjected to an interference laser irradiation, using an excimer laser light. In particular, the excimer laser light is split into two laser lights, and these laser lights interfere with each other to produce interference fringes on the photo-resist layer 142. Namely, the photo-resist layer 142 is exposed to the interference fringes, and an interference fringe pattern is recorded as a latent image in the photo-resist layer 142.

Figure 11B:
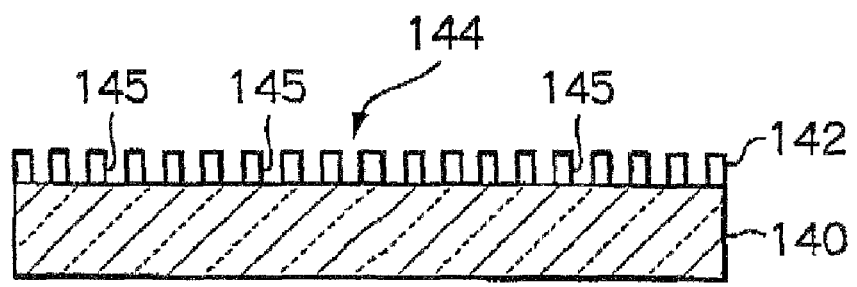
FIG. 11B is a conceptual explanatory view showing another representative step of the fifth embodiment of the formation method according to the present invention.

Then, by photographically developing the photo-resist layer 142, a fine groove mask pattern 144 corresponding to the interference fringe pattern is formed in the photo-resist layer 142, as shown in FIG. 11B. Namely, the fine groove mask pattern 144 is defined by a plurality of fine grooves 145 which are formed in the photo-resist layer 142 at regular intervals.

Note, of course, a photo-resist material for the photo-resist layer 142 must have a sufficient resolution power before the interference fringe pattern can be recorded in the photo-resist layer 142.

Then, the glass substrate 140 carrying the fine groove mask pattern 144 is immersed in an etching solution 146, whereby the glass substrate 140 is subjected to an isotropic etching process. The etching solution 128 is composed of an aqueous solution containing fluoric acid as an etchant component, and is symbolically represented by a plurality of thick short bars in FIG. 11C.

Figure 11C:
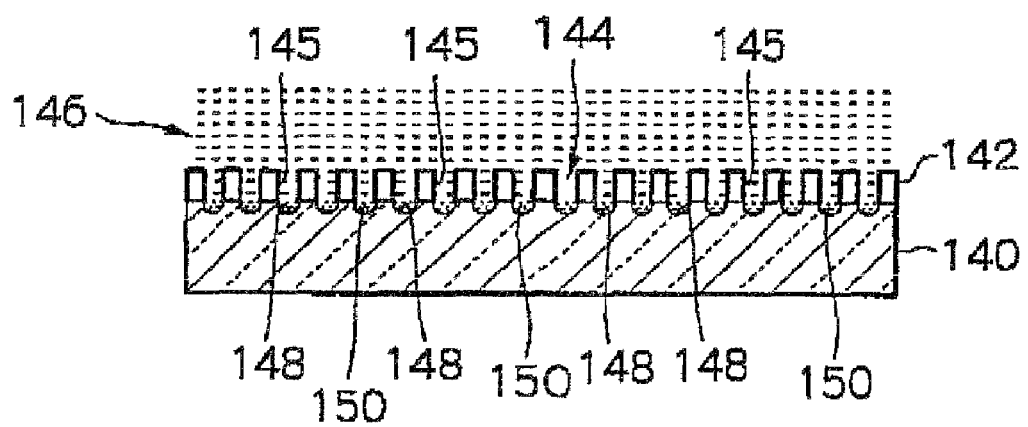
FIG. 11C is a conceptual explanatory view showing yet another representative step of the fifth embodiment of the formation method according to the present invention.
Figure 11D:
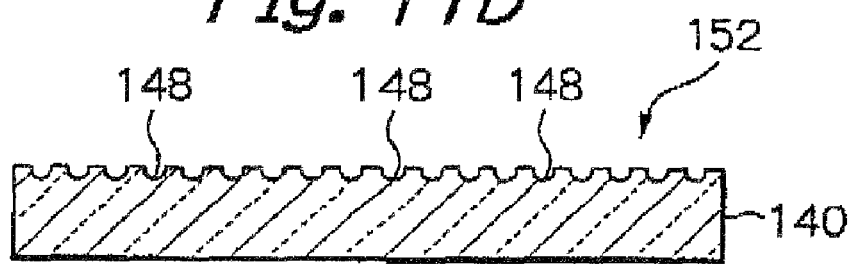
FIG. 11D is a conceptual explanatory view showing still yet another representative step of the fifth embodiment of the formation method according to the present invention.

Thus, the glass substrate 140 is etched such that a plurality of fine grooves 148 corresponding to the fine grooves 145 are formed in the glass substrate 140, and the etching of the glass substrate 140 is automatically stopped due to production of insoluble matter 150, which is symbolically represented by a plurality of small solid circles in FIG. 11C. Of course, when the etching of the glass substrate 140 is stopped, the formation of the fine grooves 148 in the glass substrate 140 is finished.

After the etching of the glass substrate 140 is stopped, the glass substrate 140 is taken out of the etching solution 146, and the fine groove mask pattern 144 is removed from the glass substrate 140, resulting in production of diffraction grating 152 having the plurality of fine grooves 148, as shown in FIG. 11C. This diffraction grating 152 may be used in, for example, an organic electroluminescence device, as disclosed in the aforesaid Publication No. EHI-11-283751.

Similar to the first embodiment, in the fifth embodiment, for example, by previously investigating a relationship between a width of the fine grooves 145 and a width of the finished fine grooves 148, it is possible to easily determine the width of the fine grooves 145 to be formed in the resist layer 142.

Note, the various modifications explained regarding the first embodiment may be applied to the fifth embodiment. Also, note, the various merits or advantages regarding the first embodiment are true for the fifth embodiment.

Sixth Embodiment

FIGS. 12A to 12D conceptually show representative steps of a sixth embodiment of the formation method according to the present invention, to form a liquid-crystal-molecule alignment layer as a finely-structured part.

Figure 12A:
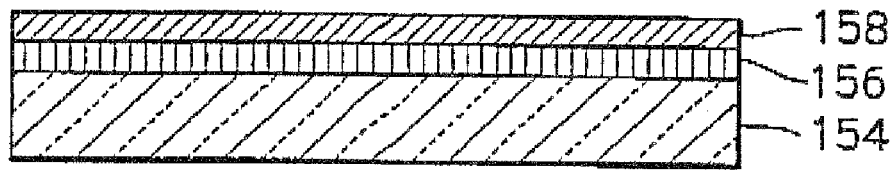
FIG. 12A is a conceptual explanatory view showing a representative step of a sixth embodiment of the formation method according to the present invention, to form a liquid-crystal-molecule orientation film as a finely-structured part.

In FIG. 12A, reference 154 indicates a glass substrate used to manufacture a liquid crystal display, and a transparent electrode layer 156 is formed on the glass substrate 154 in a well-known manner. Then, a glass film layer 158 is formed on the transparent electrode layer 156, and features substantially the same percentage composition as the glass substrate 30 used in the first embodiment. The glass film layer 158 is processed in accordance with the present invention, thereby producing a liquid-crystal-molecule alignment layer, as stated below.

Figure 12B:
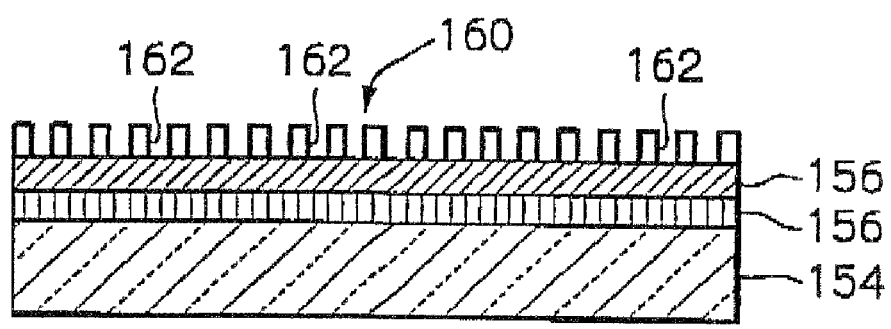
FIG. 12B is a conceptual explanatory view showing another representative step of the sixth embodiment of the formation method according to the present invention.

First, as shown in FIG. 12B, a fine groove mask pattern 160 is formed on the glass film layer 158 in substantially the same manner as the fine groove mask pattern 144 in the fifth embodiment (FIG. 11B). Namely, the fine groove mask pattern 160 is defined by a plurality of fine grooves 162 arranged at regular intervals.

Figure 12C:
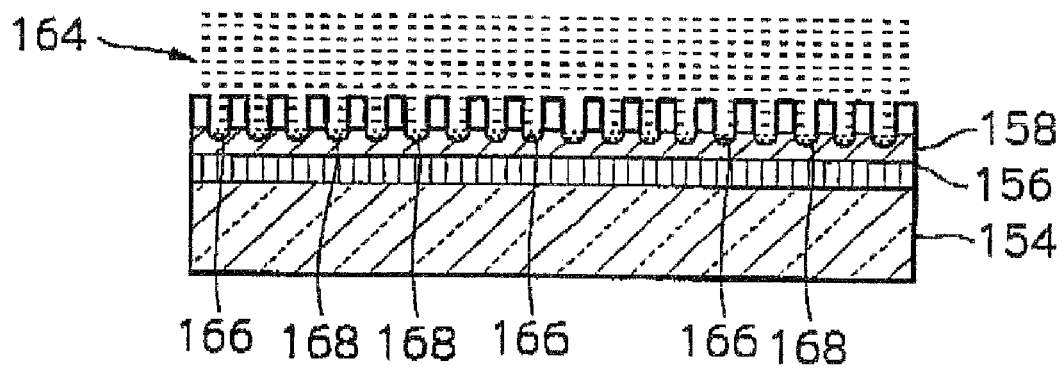
FIG. 12C is a conceptual explanatory view showing yet another representative step of the sixth embodiment of the formation method according to the present invention.

Then, as shown in FIG. 12C, the glass substrate 154 carrying the transparent electrode layer 156, the glass film layer 158, and the fine groove mask pattern 160 is immersed in an etching solution 164, whereby the glass film layer 158 is subjected to an isotropic etching process. The etching solution 164 is composed of an aqueous solution containing fluoric acid as an etchant component, and is symbolically represented by a plurality of thick short bars in FIG. 12C.

Thus, the glass film layer 158 is etched such that a plurality of fine grooves 166 corresponding to the fine grooves 162 are formed in the glass film layer 158, and the etching of the glass film layer 158 is automatically stopped due to production of insoluble matter 168, which is symbolically represented by a plurality of small solid circles in FIG. 12C. Of course, when the etching of the glass substrate 140 is stopped, the formation of the fine grooves 148 in the glass film layer 158 is finished.

Figure 12D:
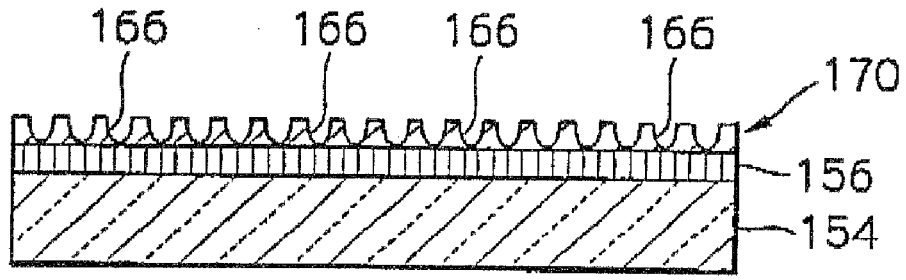
FIG. 12D is a conceptual explanatory view showing still yet another representative step of the sixth embodiment of the formation method according to the present invention.

After the etching of the glass film layer 158 is stopped, the glass substrate 154 is taken out of the etching solution 164, and the fine groove mask pattern 160 is removed from the glass film layer 158, resulting in production of a liquid-crystal-molecule alignment layer 170 having the plurality of fine grooves 166, as shown in FIG. 12D.

Similar to the first embodiment, in the sixth embodiment, for example, by previously investigating a relationship between a width of the fine grooves 162 and a width of the finished fine grooves 166, it is possible to easily determine the width of the fine grooves 162 to be formed in the fine groove mask pattern 160.

Note that the various modifications explained regarding the first embodiment may be applied to the sixth embodiment. Also, note that the various merits or advantages regarding the first embodiment are true for the sixth embodiment.

Seventh Embodiment

FIGS. 13A to 13D conceptually show representative steps of a seventh embodiment of the formation method according to the present invention, to form a wire-grid type optical polarizing element as a finely-structured part.

Figure 13A:
FIG. 13A is a conceptual explanatory view showing a representative step of a seventh embodiment of the formation method according to the present invention, to form a wire-grid type optical polarizing element as a finely-structured part.

In FIG. 13A, reference 172 indicates a glass substrate, and a metal film layer 174 is formed on the glass substrate 172. For example, the metal film layer 174 may be made of a titanium aluminum alloy, and the formation of the metal film layer 174 may be performed by a sputtering process.

Figure 13B:
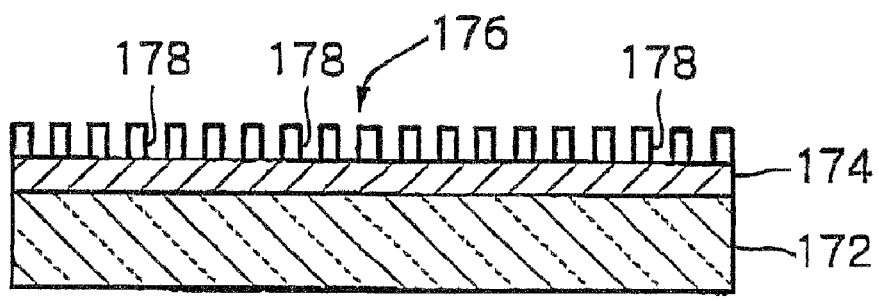
FIG. 13B is a conceptual explanatory view showing another representative step of the seventh embodiment of the formation method according to the present invention.

Then, as shown in FIG. 13B, a fine groove mask pattern 176 is formed on the metal film layer 174 in substantially the same manner as the fine groove mask pattern 144 in the fifth embodiment (FIG. 11B). Namely, the fine groove mask pattern 176 is defined by a plurality of fine grooves 178 arranged at regular intervals.

Figure 13C:
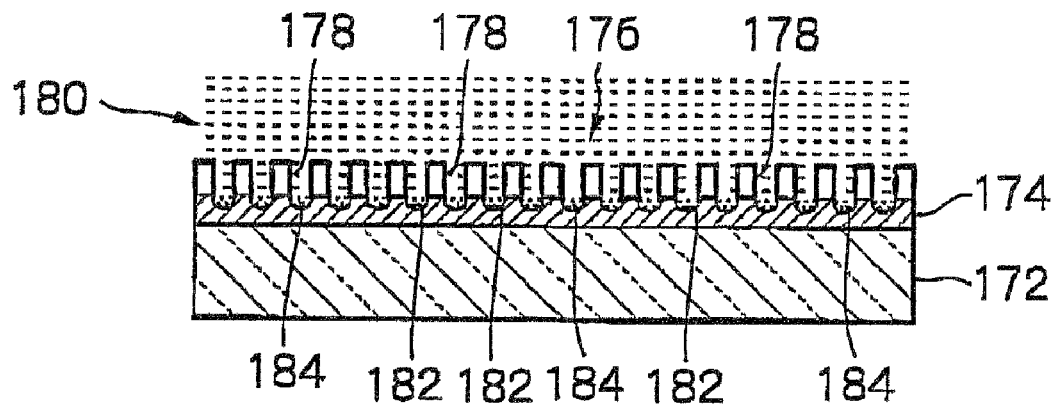
FIG. 13C is a conceptual explanatory view showing yet another representative step of the seventh embodiment of the formation method according to the present invention.

Then, as shown in FIG. 13C, the glass substrate 172 carrying the metal film layer 174, and the fine groove mask pattern 176 is immersed in a metal-film etching solution 180 containing fluoric acid, whereby the metal film layer 174 is subjected to an isotropic etching process. In FIG. 13C, the metal-film etching solution 180 is symbolically represented by a plurality of thick short bars.

Thus, the metal film layer 174 is etched such that a plurality of fine grooves 182 corresponding to the fine grooves 178 are formed in the metal film layer 174, and the etching of the metal film layer 174 is automatically stopped, because the metal layer 174 contains an aluminum component as an etching-control component. In particular, as the etching of the metal film layer 174 progresses, the aluminum component is eluted out of the metal film layer 174, and reacts with fluoric acid to produce aluminum fluoride. Namely, similar to the first embodiment, aluminum fluoride is separated out as the insoluble matter 184 in metal-film etching solution 180, resulting in the stoppage of the etching of the metal film layer 174. In this embodiment, the etching of the metal film layer 174 is controlled so as to be stopped when the fine grooves 182 are extended to the surface of the glass substrate 172.

Figure 13D:
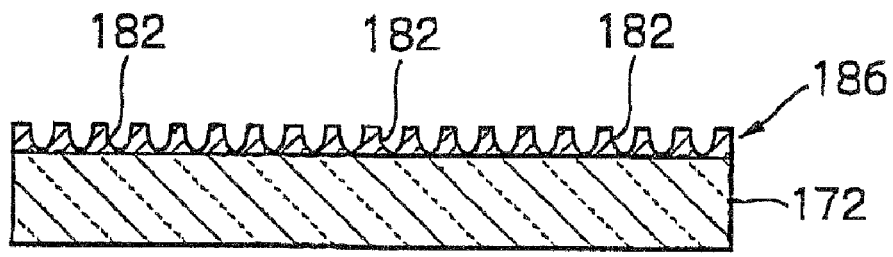
FIG. 13D is a conceptual explanatory view showing still yet another representative step of the seventh embodiment of the formation method according to the present invention.

After the etching of the metal film layer 174 is stopped, the glass substrate 172 is taken out of the metal-film etching solution 180, and the fine groove mask pattern 176 is removed, resulting in production of a wire-grid type optical polarizing element 186, as shown in FIG. 13D.

Similar to the first embodiment, in the seventh embodiment, for example, by previously investigating a relationship between a width of the fine grooves 178 and a width of the finished fine grooves 182, it is possible to easily determine the width of the fine grooves 178 to be formed in the fine groove mask pattern 176.

Note that the various modifications explained regarding the first embodiment may be applied to the seventh embodiment. Also, note that the various merits or advantages regarding the first embodiment are true for the seventh embodiment.

Eighth Embodiment

FIGS. 14A to 14D conceptually show representative steps of an eighth embodiment of the formation method according to the present invention, to form a chemical microchip as a finely-structured part. FIG. 15 shows the chemical microchip formed by the eighth embodiment of the formation method according to the present invention. Note, each of FIGS. 14A to 14D corresponds to a cross-sectional view taken along the Y-Y' line of FIG. 15.

Figure 14A:
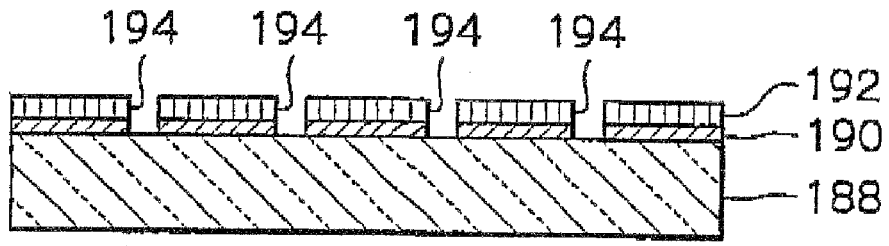
FIG. 14A is a conceptual explanatory view showing a representative step of an eighth embodiment of the formation method according to the present invention, to form a chemical microchip as a finely-structured part.
Figure 15:
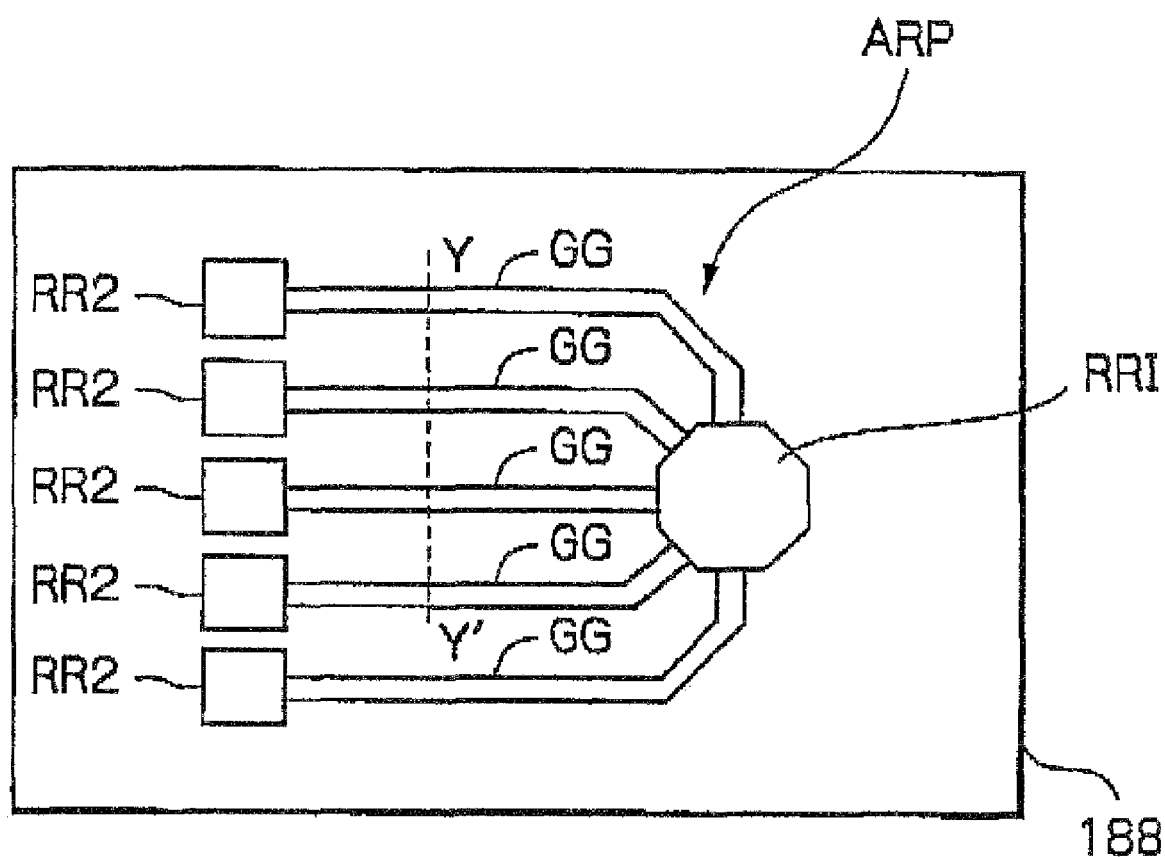
FIG. 15 is a plane view of the chemical microchip formed by the eighth embodiment of the formation method according to the present invention.

In FIG. 14A, reference 188 indicates a non-alkali glass substrate having a suitable thickness. The glass substrate 188 features substantially the same percentage composition as the glass substrate 30 used in the first embodiment. Similar to the first embodiment, after the glass substrate 188 is rinsed, a chromium mask layer 190 having a suitable thickness is formed on the glass substrate 188 by a sputtering process, and then a positive type resist layer 192 having a suitable thickness is formed on the mask layer 190 by a spin-coat process.

Using a photolithography process, an imitative recess pattern corresponding to an actual recess pattern to be formed in the glass substrate 188 is formed in the resist layer 192. Referring to FIG. 15, the actual recess pattern is generally indicated reference ARP, and includes a reactor reservoir RR1, five reagent reservoirs RR2, and five guide grooves GG for communicating the reactor reservoir RR1 with the respective square reservoir RR2. Thus, the imitative recess pattern also includes imitative guide grooves corresponding to the guide grooves GG, and the imitative guide grooves are indicated by reference 194 in FIG. 13A.

Then, a chromium-etching solution composed of diammonium cerium nitrate as a main component is prepared, the glass substrate 188 carrying both the layers 190 and 192 is immersed in the chromium-etching solution, whereby the mask layer (chromium) 190 is etched such that the imitative guide grooves 194 are extended into the mask layer 190, as representatively shown in FIG. 14A.

Figure 14B:
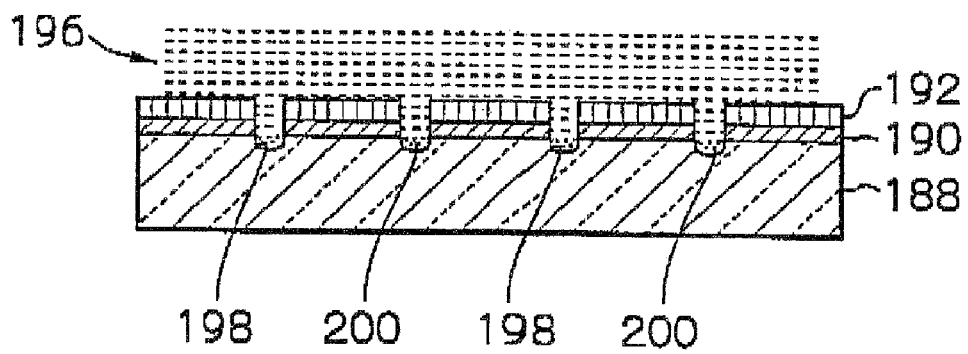
FIG. 14B is a conceptual explanatory view showing another representative step of the eighth embodiment of the formation method according to the present invention.

After the etching process of the mask layer 190, as shown in FIG. 14B, the glass substrate 188 carrying both the layers 190 and 192 is immersed in an etching solution 196, whereby the glass substrate 188 is subjected to an isotropic etching process. The etching solution 196 is composed of an aqueous solution containing fluoric acid as an etchant component, and is symbolically represented by a plurality of thick short bars in FIG. 14B. Thus, the glass substrate 188 is etched such that a recess pattern corresponding to the actual recess pattern ARP is initially formed in the glass substrate 188. The recess pattern includes grooves corresponding to the guide grooves GG, and these grooves are indicated by reference 198 in FIG. 14B.

Figure 14C:
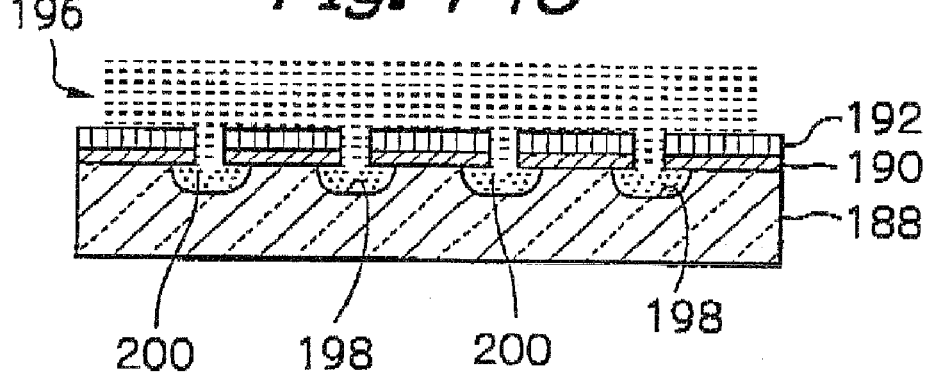
FIG. 14C is a conceptual explanatory view showing yet another representative step of the eighth embodiment of the formation method according to the present invention.
Figure 14D:
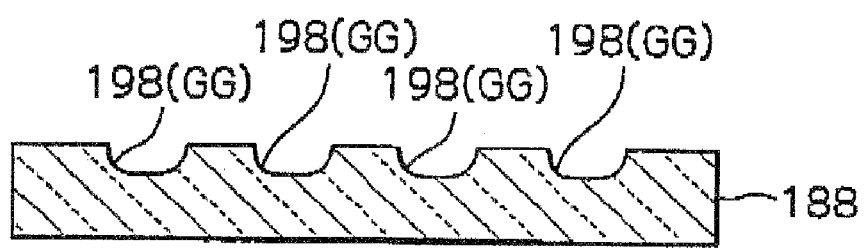
FIG. 14D is a conceptual explanatory view showing still yet another representative step of the eighth embodiment of the formation method according to the present invention.

As shown in FIG. 14C, as the etching of the glass substrate 188 progresses, the recess pattern (198) becomes larger, because a fresh part of the etching solution 196 is introduced into the recess pattern (198). Nevertheless, as explained in the first embodiment, the etching of the glass substrate 188 is automatically stopped due to production of insoluble matter 200, which is symbolically represented by a plurality of small solid circles in FIGS. 14B and 14C. Of course, when the etching of the glass substrate 188 is stopped, the formation of the recess pattern (198) in the glass substrate 188 is finished, and the recess pattern (188) is equivalent to the actual recess pattern ARP.

After the etching of the glass substrate 188 is stopped, the glass substrate 188 is taken out of the etching solution 196, and is processed with acetone to thereby remove the resist layer 192 therefrom. Subsequently, the glass substrate 188 is processed with the chromium-etching solution to thereby remove the mask layer 190 therefrom, and then the insoluble matter 200 is rinsed out of the recess pattern (198), resulting in production of a chemical microchip as shown in FIG. 15.

Similar to the first embodiment, in the eighth embodiment, for example, by previously investigating a relationship between a width of the imitative grooves 194 and a width of the finished grooves 198 (GG), it is possible to easily determine the width of the imitative grooves 194 to be formed in the resist layer 192.

Note that the various modifications explained regarding the first embodiment may be applied to the eighth embodiment. Also, note that the various merits or advantages regarding the first embodiment are true for the eighth embodiment.

Finally, it will be understood by those skilled in the art that the foregoing description is of preferred embodiments of the processes and device, and that various changes and modifications may be made to the present invention without departing from the spirit and scope thereof.

The invention claimed is:

1. A matrix for molding a micro-lens array, the matrix comprising:
   a glass substrate having an array of hemisphere-like recesses formed therein,
   wherein said glass substrate contains at least one etching control component at a concentration which causes an elution of said etching control component from said glass substrate when being subjected to an isotropic etching process using an etching solution for the formation of said hemisphere-like recesses in said glass substrate,
   wherein said isotropic etching process comprises:
   applying a mask having an array of openings to said glass substrate; and
   etching said glass substrate with said etching solution so that said array of hemisphere-like recesses is formed so as to correspond to said array of openings, the etching of said glass substrate being allowed to continue until the etching is stopped when the etching control component eluted out said glass substrate in the etching solution accumulates on inner surfaces of said hemisphere-like recesses so that the inner surfaces of said hemisphere-like recesses are prevented from contacting a fresh part of the etching solution.

2. A matrix as set forth in claim 1, wherein said etching control component is composed of at least one selected from the group consisting of aluminum oxide, magnesium oxide, calcium oxide, potassium oxide, strontium oxide, barium oxide, lithium oxide, sodium oxide, cesium oxide, zinc oxide, and lead oxide.

3. A matrix as set forth in claim 1, wherein said etching control component of said glass substrate is at least 35% in weight.

* * * * *